United States Patent
Lin et al.

(10) Patent No.: US 11,660,597 B2
(45) Date of Patent: May 30, 2023

(54) MICROFLUIDIC DEVICE AND DETECTION METHOD THEREOF

(71) Applicant: Shanghai AVIC OPTO Electronics Co., Ltd., Shanghai (CN)

(72) Inventors: Baiquan Lin, Shanghai (CN); Kerui Xi, Shanghai (CN); Zhenyu Jia, Shanghai (CN); Junting Ouyang, Shanghai (CN); Feng Qin, Shanghai (CN); Xuhui Peng, Shanghai (CN)

(73) Assignee: Shanghai AVIC OPTO Electronics Co., Ltd., Shanghai (CN)

( * ) Notice: Subject to any disclaimer, the term of this patent is extended or adjusted under 35 U.S.C. 154(b) by 125 days.

(21) Appl. No.: 17/231,842

(22) Filed: Apr. 15, 2021

(65) Prior Publication Data
US 2021/0229096 A1    Jul. 29, 2021

(30) Foreign Application Priority Data
Feb. 1, 2021   (CN) .......................... 202110139615.2

(51) Int. Cl.
  *G01N 21/01*   (2006.01)
  *B01L 3/00*    (2006.01)
  *G01N 21/59*   (2006.01)

(52) U.S. Cl.
  CPC ........ *B01L 3/502715* (2013.01); *G01N 21/01* (2013.01); *G01N 21/59* (2013.01); *H10K 65/00* (2023.02); *B01L 2300/0663* (2013.01)

(58) Field of Classification Search
  CPC ............ B01L 3/502715; B01L 3/5027; B01L 3/502792; G01N 21/01; G01N 21/59; G01N 21/255
  See application file for complete search history.

(56) References Cited

U.S. PATENT DOCUMENTS

| 2019/0092623 A1* | 3/2019 | Ding | B01L 3/502715 |
| 2020/0158628 A1* | 5/2020 | Chen | G01N 21/8806 |

FOREIGN PATENT DOCUMENTS

| CN | 103026294 A | 4/2013 |
| CN | 107589600 A | 1/2018 |

(Continued)

OTHER PUBLICATIONS

Chinese Office Action related to Application No. 202110139615.2; reported on Jan. 21, 2022.

*Primary Examiner* — Rebecca C Bryant
(74) *Attorney, Agent, or Firm* — von Briesen & Roper, s.c.

(57) ABSTRACT

A microfluidic device includes: first substrate, microfluidic channel layer, and second substrate; the first substrate includes light source layer including a plurality of light source structures, the light source structure includes first electrode, second electrode, and an electroluminescence module, and when being turned on, emits light passing through the microfluidic channel layer and irradiating the second substrate; the second substrate includes photoelectric detection layer including a plurality of photoelectric detection structures and driving electrode layer including a plurality of driving electrodes and a plurality of driving circuits, the photoelectric detection structure includes third electrode, fourth electrode, and photoelectric conversion module arranged therebetween, and when being turned on, generates an electrical signal according to an incident light signal; the driving circuit is configured to apply a voltage to each driving electrode such that a droplet moves in a microfluidic channel of the microfluidic channel layer.

20 Claims, 18 Drawing Sheets

(56) References Cited

FOREIGN PATENT DOCUMENTS

| | | | | |
|---|---|---|---|---|
| CN | 109092379 A | * | 12/2018 | ........ B01L 3/502792 |
| CN | 109092379 A | | 12/2018 | |
| CN | 110806386 A | | 2/2020 | |
| CN | 111359688 A | * | 7/2020 | ............ B01L 3/5027 |

* cited by examiner

MICROFLUIDIC DEVICE AND DETECTION METHOD THEREOF

CROSS-REFERENCE TO RELATED APPLICATION(S)

This application claims priority to Chinese Patent Application No. 202110139615.2, titled "MICROFLUIDIC DEVICE AND DETECTION METHOD THEREOF", filed Feb. 1, 2021, the disclosure of which is incorporated herein by reference in its entirety.

TECHNICAL FIELD

Embodiments of the present disclosure relate to microfluidic technologies and, in particular, to a microfluidic device and a detection method thereof.

BACKGROUND

Microfluidic chips havestrong integration, fast analysis speed when processing samples, low loss, low material consumption, and low pollution. Therefore, the application of microfluidic chips in many fields such as biomedical research, drug synthesis screening, environmental monitoring and protection, health quarantine, judicial expertise, and biological reagents has extremely broad prospects.

At present, when microfluidic chips perform sample detection, a drive timing sequence has been determined in advance. However, a droplet in the sample is affected by raw materials, a process, or environmental issues, and it is difficult for a motion state of the droplet to execute according to the preset drive timing sequence. Therefore, it is difficult for an experimenter to know a position of the droplet, which easily affects a subsequent experiment process, resulting in reducing experiment efficiency, and even causing failure of the experiment.

SUMMARY

Embodiments of the present disclosure provide a microfluidic device and a detection method thereof, so that an effect of real-time positioning for a droplet can be achieved.

Embodiments of the present disclosure provide a microfluidic device. The microfluidic device includes a first substrate and a second substrate that are disposed oppositely and a microfluidic channel layer arranged between the first substrate and the second substrate.

The first substrate includes a light source layer. The light source layer includes a plurality of light source structures. The light source structure includes a first electrode, a second electrode, and an electroluminescence module arranged between the first electrode and the second electrode. In a case where the light source structure is turned on, the light source structure is configured to emit light passing through the microfluidic channel layer and irradiating the second substrate.

The second substrate includes a photoelectric detection layer and a driving electrode layer. The photoelectric detection layer includes a plurality of photoelectric detection structures. The photoelectric detection structure includes a third electrode, a fourth electrode, and a photoelectric conversion module arranged between the third electrode and the fourth electrode. The photoelectric detection structure generates an electrical signal according to an incident light signal in a case where the photoelectric detection structure is turned on.

The driving electrode layer includes a plurality of driving electrodes and a plurality of driving circuits. The driving circuit is configured to apply a voltage to the driving electrode such that a droplet moves in a microfluidic channel of the microfluidic channel layer.

Based on the same inventive concept, embodiments of the present disclosure further provide a detection method of the preceding microfluidic device. The working process of the microfluidic device includes a droplet driving phase and a photoelectric detection phase. The photoelectric detection phase includes a position detection sub-phase. The detection method includes steps described below.

In the position detection sub-phase, the light source structure is controlled to emit light, each photoelectric detection structure is turned on at different times to output an electrical signal, and the droplet is positioned according to the electrical signal output by each photoelectric detection structure.

In the droplet driving phase, the light source structure is controlled not to emit light, and different voltages are applied to the driving electrodes so that an electric field is generated between adjacent driving electrodes to drive the droplet to move in the microfluidic channel layer according to a preset movement path.

In embodiments of the present disclosure, the light source structure of the first substrate is served as a light source generating structure, the light emitted by the light source structure enters the photoelectric detection structure of the second substrate through the microfluidic channel layer, a photoelectric conversion module of the photoelectric detection structure generates a photoelectric reaction according to an intensity of received light, and then the photoelectric detection structure outputs an electrical signal. An intensity of light received by the photoelectric conversion module at a droplet position is different from that of light received by the photoelectric conversion module at a non-liquid-level position. In such a way, according to different electrical signals of the photoelectric detection structures, the position of the droplet is determined or whether the droplet reaches a preset position is determined, so that real-time positioning for the droplet and real-time position detection for the droplet can be achieved. In embodiments of the present disclosure, the light source structure generates light for droplet detection, hence there is no limitation on an environment where it is used; moreover, the microfluidic channel layer is disposed between the first substrate and the second substrate, and the droplet moves in an sealed and clean microfluidic channel layer, hence the detection accuracy is not affected by the environment where it is used, thereby improving the detection success rate and detection accuracy.

BRIEF DESCRIPTION OF DRAWINGS

In order that technical solutions in embodiments of the present disclosure or the related art are described more clearly, drawings to be used in the description of the embodiments or the related art are briefly described hereinafter. Apparently, although the drawings in the description are some embodiments of the present disclosure, for those skilled in the art, these drawings may be expanded and extended to other structures and drawings according to the basic concepts of the device structure, driving method, and manufacturing method disclosed and indicated in embodiments of the present disclosure. Those, all, undoubtedly, should fall within the scope of the claims of the present disclosure.

DETAILED DESCRIPTION

In order that the objects, technical solutions, and advantages of the present disclosure are clearer, the technical solutions of the present disclosure are described more clearly and completely through the implementations hereinafter, with reference to drawings of embodiments of the present disclosure. Apparently, the embodiments described herein are some embodiments, rather than all embodiments, of the present disclosure. All other embodiments obtained by those skilled in the art based on the basic concepts disclosed and indicated in embodiments of the present disclosure are within the scope of the present disclosure.

Figure 1:
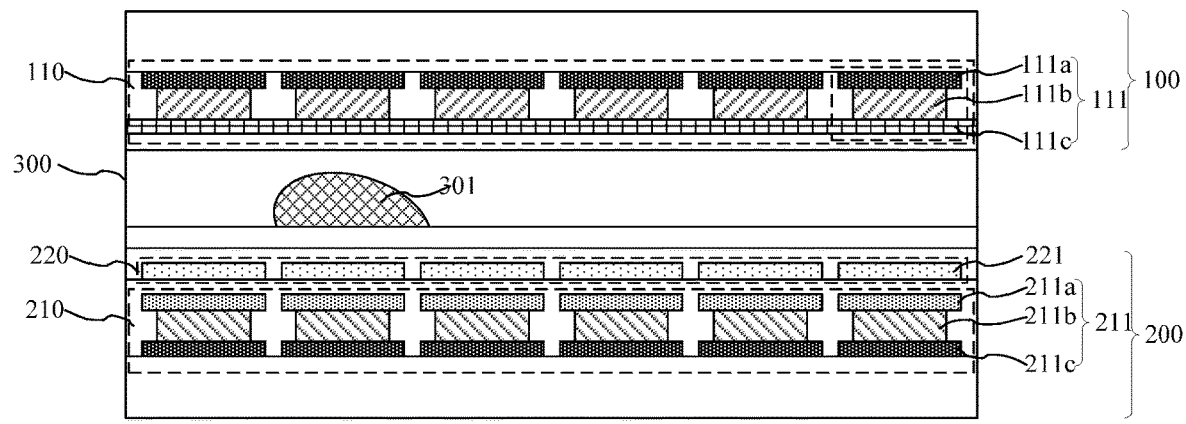
FIG. 1 is a schematic diagram of a microfluidic device according to an embodiment of the present disclosure.
Figure 2:
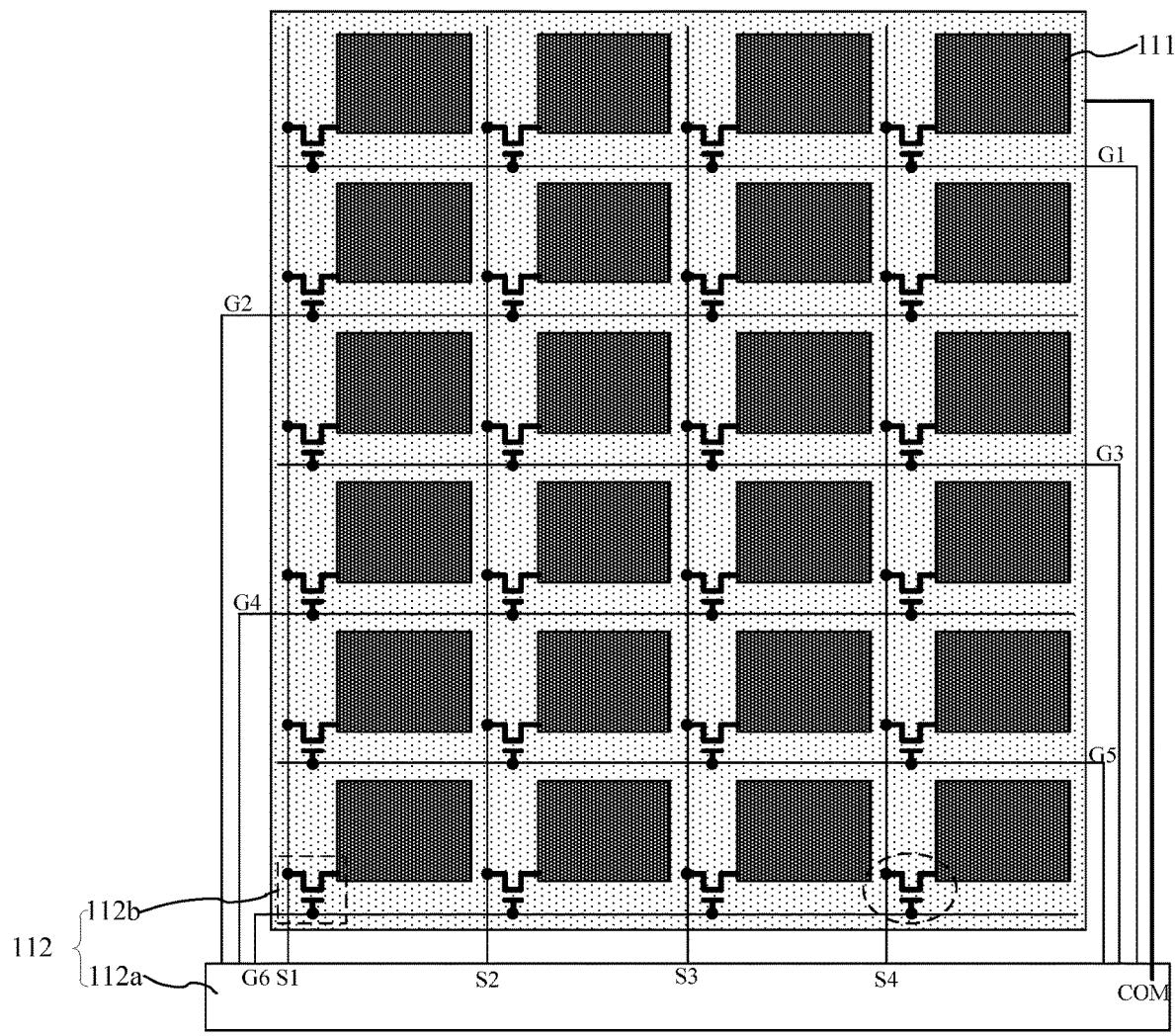
FIG. 2 is a schematic diagram of a light source layer according to an embodiment of the present disclosure.
Figure 3:
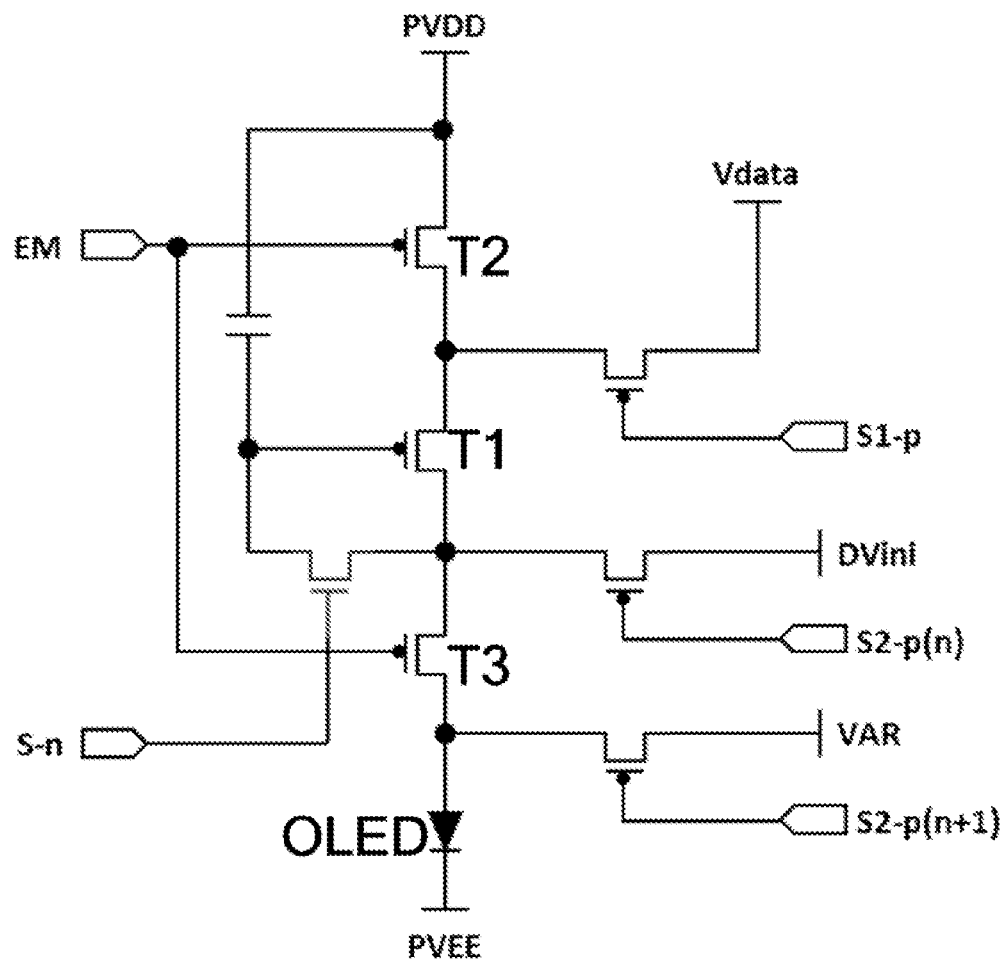
FIG. 3 is a schematic diagram of a light source switch according to an embodiment of the present disclosure.
Figure 4:
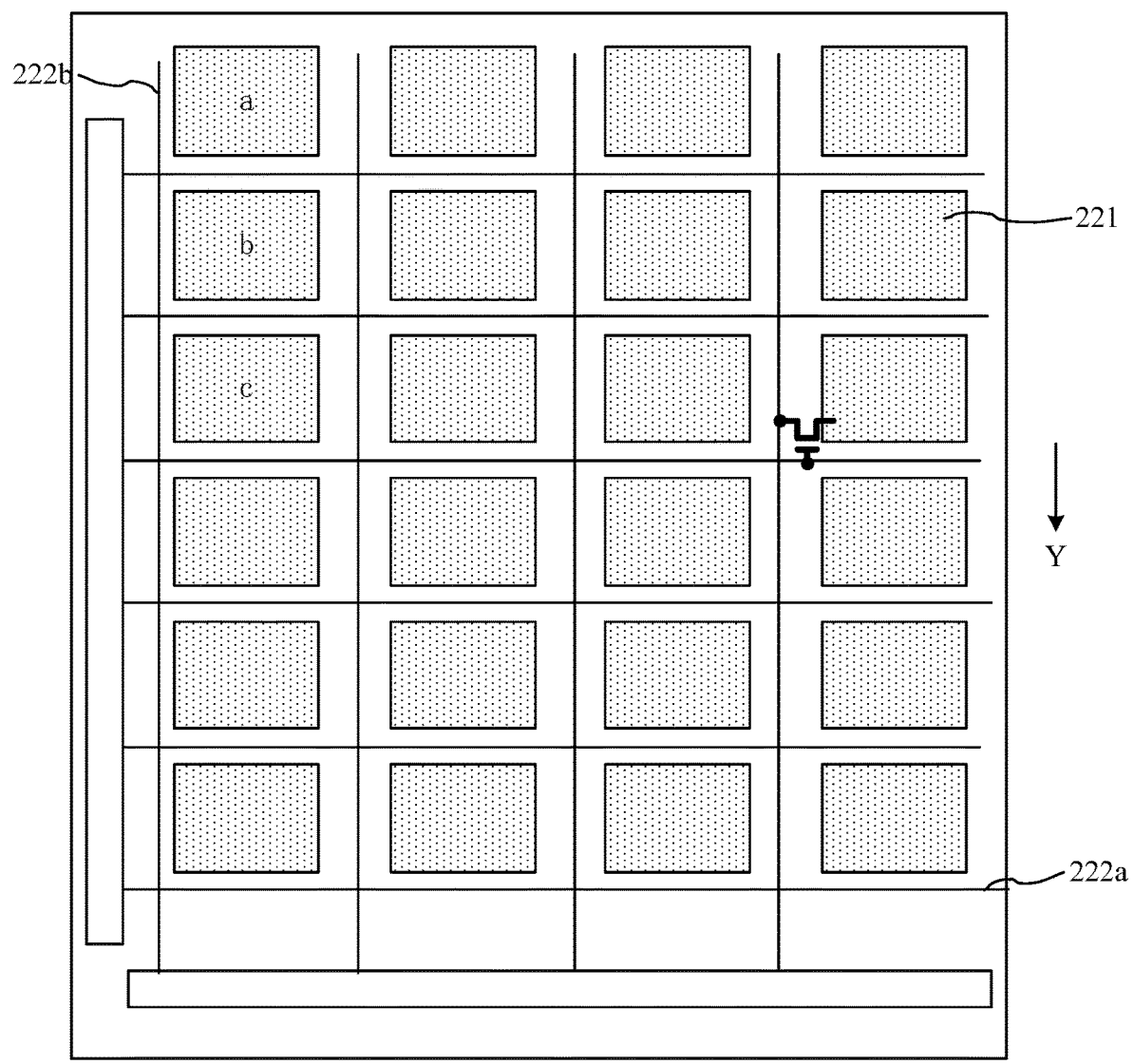
FIG. 4 is a schematic diagram of a driving electrode layer according to an embodiment of the present disclosure.

Referring to FIG. 1, FIG. 1 is a schematic diagram of a microfluidic device according to an embodiment of the present disclosure, FIG. 2 is a schematic diagram of a light source layer according to an embodiment of the present disclosure, FIG. 3 is a schematic diagram of a light source switch according to an embodiment of the present disclosure, and FIG. 4 is a schematic diagram of a driving electrode layer according to an embodiment of the present disclosure. The microfluidic device provided in the present embodiment includes a first substrate 100 and a second substrate 200 that are disposed oppositely and a microfluidic channel layer 300 arranged between the first substrate 100 and the second substrate 200; the first substrate 100 includes a light source layer 110, the light source layer 110 includes a plurality of light source structures 111, the light source structure 111 includes a first electrode 111$a$, a second electrode 111$c$, and an electroluminescence module 111$b$ arranged between the first electrode 111$a$ and the second electrode 111$c$, and in a case where the light source structure 111 is turned on, the light source structure 111 is configured to emit light passing through the microfluidic channel layer 300 and irradiating the second substrate 200; the second substrate 200 includes a photoelectric detection layer 210 and a driving electrode layer 220, the photoelectric detection layer 210 includes a plurality of photoelectric detection structures 211, the photoelectric detection structure 211 includes a third electrode 211$a$, a fourth electrode 211$c$, and a photoelectric conversion module 211$b$ arranged between the third electrode 211$a$ and the fourth electrode 211$c$, and the photoelectric detection structure 211 generates an electrical signal according to an incident light signal, in a case where the photoelectric detection structure 211 is turned on; the driving electrode layer 220 includes a plurality of driving electrodes 221 and a plurality of driving circuits 222, and the driving circuit 222 is configured to apply a voltage to the driving electrode 221 such that a droplet 301 moves in a microfluidic channel of the microfluidic channel layer 300.

In the present embodiment, the first substrate 100 includes the light source layer 110, and the light source layer 110 is a light source generating film layer for emitting light. The light source layer 110 includes a plurality of light source structures 111 and further includes a light source control circuit 112. The light source control circuit 112 independently controls whether each light source structure 111 emits light or not. In a case where the light source control circuit 112 controls the light source structure 111 to be turned on, the light source structure 111 emits light. In a case where the light source control circuit 112 controls the light source structure 111 to be turned off, the light source structure 111 does not emit light. Alternatively, the light source control circuit 112 includes a light source driving chip 112a and a plurality of light source switches 112b. The light source driving chip 112a controls the light source switch 111b of the light source structure 111 to be turned on or off to control whether the light source structure 111 emits light. In other embodiments, alternatively, the light source control circuit include a light source driving chip, and the light source driving chip may directly control whether each light source structure emits light or not.

The light source structure 111 includes a first electrode 111a, a second electrode 111c, and an electroluminescence module 111b arranged between the first electrode 111a and the second electrode 111c. The light source control circuit 112 at a same time energizes the first electrode 111a and the second electrode 111c such that an electrical signal capable of controlling electroluminescence of the electroluminescence module 111b is generated between the first electrode 111a and the second electrode 111c. In such a way, in a case where this electrical signal flows through the electroluminescence module 111b, the electroluminescence module 111b is electroluminescent. Alternatively, the first electrode 111a is an anode and the second electrode 111c is a cathode. Alternatively, a plurality of the light source structures 111 share the second electrode 111c, that is, the second electrode 111c is a surface electrode, and the first electrode 111a is a bulk electrode. In other embodiments, alternatively, the first electrode is a cathode and the second electrode is an anode.

Alternatively, the first electrode 111a and the second electrode 111c are stacked and insulated, the electroluminescence module 111b is arranged between the first electrode 111a and the second electrode 111c, and the electroluminescence module 111b includes an organic luminescent material.

In a case where the light source structure 111 is turned on, the light source structure 111 is configured to emit light passing through the microfluidic channel layer 300 and irradiating the second substrate 200. The second electrode 111c is close to the microfluidic channel layer 300. Alternatively, the first electrode 111a is a reflective electrode, and the second electrode 111c is a transparent electrode so that it is ensured that the light emitted by the light source structure 111b is irradiated toward the second substrate 200. For example, the first electrode 111a is a metal electrode, and the second electrode 111c is an ITO electrode.

The structure of the light source switch 112b is as shown in FIG. 3. Alternatively, the light source structure 111 is an OLED, and the light source switch 112b of the light source structure 111 has a 7T1C structure; alternatively, the light source structure is a micro LED, and the light source switch of the light source structure has a 2T1C structure; in FIG. 2, a transistor is taken as an example of the light source switch. In other embodiments, alternatively, the light source switch may also be a MOSFET, and the light source driving chip provides a PWM signal to the light source switch to control whether the light source structure 111 emits light. A light-emitting control signal line EM controls whether a driving current flows into the light source structure.

As shown in FIG. 3, the driving transistor T1 is configured to provide a driving current for the light source structure OLED, and a light-emitting control signal controls T2 and T3 to be turned on or off at a same time. In a case where T2 and T3 are turned on at a same time, the driving current flows through the OLED. An output end of the light source switch 112b is electrically connected to the first electrode of the light source structure 111, and the second electrode is electrically connected to a common voltage signal line COM. A light source control signal line G, a light source input signal line S, and the common voltage signal line COM are electrically connected to the light source driving chip 112a, respectively. The light source driving chip 112a independently controls the on and off of each light source switch 112b according to working requirements of the microfluidic device.

It can be understood that, an insulating hydrophobic layer for insulation is further provided between the light source structure 111 and the microfluidic channel layer 300. This insulating hydrophobic layer may include an insulating layer and a hydrophobic layer that are stacked, and the insulating layer is arranged between the hydrophobic layer and the second electrode.

Alternatively, the light source structure of the light source layer, in a case where the light source structure is turned on, is configured to emit light in a first wavelength band; alternatively, the light source layer at least includes a first light source structure and a second light source structure, and the first light source structure is configured to emit light in a first wavelength band and the second light source structure is configured to emit light in a second wavelength band. In the present disclosure, the light source structure of the light source layer may be completely the same, for example, organic light-emitting diodes manufactured by same manufacturing process and all emitting light in red, are adopted for the light source structure, as organic light-emitting diodes emitting light in same color emits light in a same wavelength band. Alternatively, the light source layer includes a plurality of light source groups, and each light source group includes a plurality of light source structures that are configured to emit lights in different colors. For example, a light source group includes an organic light-emitting diode emitting light in red, an organic light-emitting diode that emits light in green, and an organic light-emitting diode that emits light in blue, and lights emitted by organic light-emitting diodes in different colors are in different wavelength bands.

In the present embodiment, the microfluidic channel layer 300 arranged between the first substrate 100 and the second substrate 200 includes at least one microfluidic channel and one or more droplets 301 may enter the microfluidic channel and move in the microfluidic channel under control of the driving electrode layer 220. The second substrate 200 includes the driving electrode layer 220. The driving electrode layer 220 includes a plurality of driving electrodes 221 and a plurality of driving circuits 222. The driving circuit 222 is configured to apply a voltage to the driving electrode 221 such that the droplet 301 moves in the microfluidic channel of the microfluidic channel layer 300. Specifically, the driving circuits 222 apply voltages to the driving electrodes 221 in order that voltages on adjacent driving electrodes 221 are different, and thus an electric field is formed between the adjacent driving electrodes 221. In such a way, a voltage difference and asymmetrical deformation are generated inside the droplet 301, thereby enabling the droplet 301 to move in the microfluidic channel. It can be understood that the movement direction of the droplet 301 may be changed as potentials of the driving electrodes 221 varies.

Figure 5:
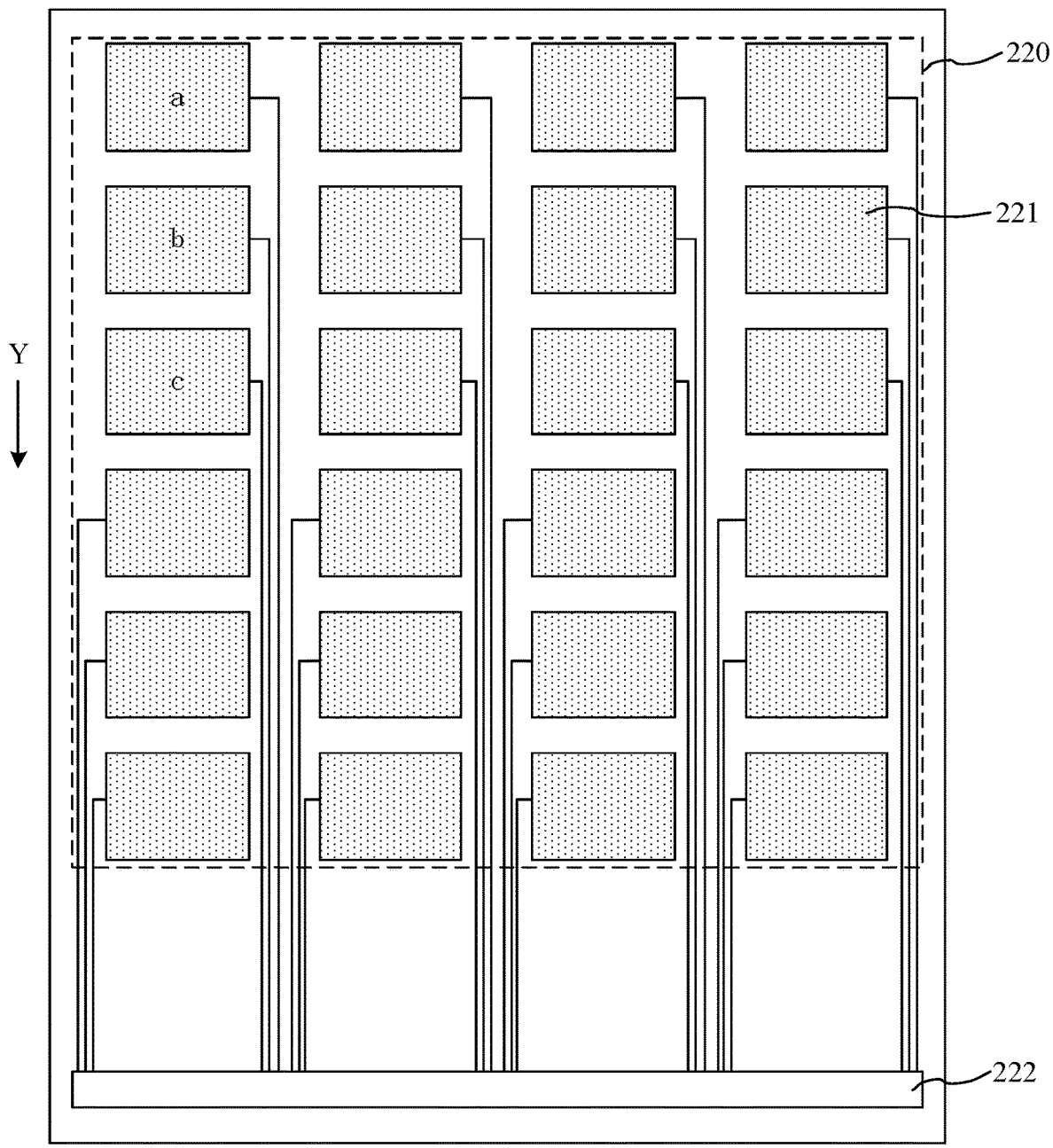
FIG. 5 is a schematic diagram of a second driving electrode layer according to an embodiment of the present disclosure.

As shown in FIG. 4, alternatively, the driving electrode layer includes a plurality of control signal lines 222a and a plurality of input signal lines 222b. The plurality of control signal lines 222a and the plurality of input signal lines 222b are insulated to define an area where each driving electrode 221 is located. The driving electrode 221 is electrically connected to an output end of one switch transistor correspondingly, a control end of this switch transistor is electrically connected to the control signal line 222a, and an input end of the switch transistor is electrically connected to the input signal line 222b. The control signal line 222a controls whether the switch transistor is turned on or not and the input signal line 222b provides a voltage signal to the driving electrode 221 through a turned-on switch transistor. It is to be noted that in the structure shown in FIG. 4, the control signal line 222a is connected to a driving circuit on a left side, and the input signal line 222b is connected to a driving circuit on a bottom side. However, embodiments of the present disclosure are not limited thereto, and it is also feasible that the control signal line 222a and the input signal line 222b are both connected to a same driving circuit, such as, to a driving chip. In other embodiments, as shown in FIG. 5, alternatively, the driving circuit 222 may be directly electrically connected to each driving electrode 221 for transmitting electrical signals to the driving electrodes 221.

It can be understood that an insulating hydrophobic layer for insulation is further provided between the driving electrode layer 210 and the microfluidic channel layer 300. This insulating hydrophobic layer may include an insulating layer and a hydrophobic layer that are stacked, and the insulating layer is arranged between the hydrophobic layer and the driving electrode.

In the present embodiment, the second substrate 200 further includes a photoelectric detection layer 210, and the photoelectric detection layer 210 is configured for photoelectric detection. The photoelectric detection layer 210 includes a plurality of photoelectric detection structures 211. The photoelectric detection structure 211 includes a third electrode 211a, a fourth electrode 211c, and a photoelectric conversion module 211b arranged between the third electrode 211a and the fourth electrode 211c. The photoelectric detection structure 211 generates an electrical signal according to an incident light signal, in a case where the photoelectric detection structure 211 is turned on. In a case where the light source structure 111 emits light, the photoelectric detection structure 211 is turned on, and the photoelectric conversion module 211b of the photoelectric detection structure 211 receives the light emitted by the light source structure 111, and then based on the received light, generates a photoelectric reaction. It can be understood that in a case where a droplet exists at the position of the photoelectric detection structure 211 or not, intensities of lights entering the photoelectric detection structure 211 are different, and thus photoelectric reactions generated by the photoelectric conversion module 211b are different.

Alternatively, in the photoelectric detection structure 211, the third electrode 211a serves as a bias electrode, and the fourth electrode 211c serves as a detection electrode. In such a way, in the photoelectric detection phase, the photoelectric detection layer 210 provides a bias voltage signal to the third electrode 211a and detects current flowing through the photoelectric conversion module 211b through the fourth electrode 211c. Alternatively, in the photoelectric detection structure 211, the third electrode 211a serves as a detection electrode, and the fourth electrode 211c serves as a bias electrode. In such a way, in the photoelectric detection phase, the photoelectric detection layer 210 provides a bias voltage signal to the fourth electrode 211c and detects the current flowing through the photoelectric conversion module 211b through the third electrode 211a. Then the photoelectric detection layer 210 may determine a position of a droplet according to a current signal of the photoelectric detection structure 211.

Figure 6:
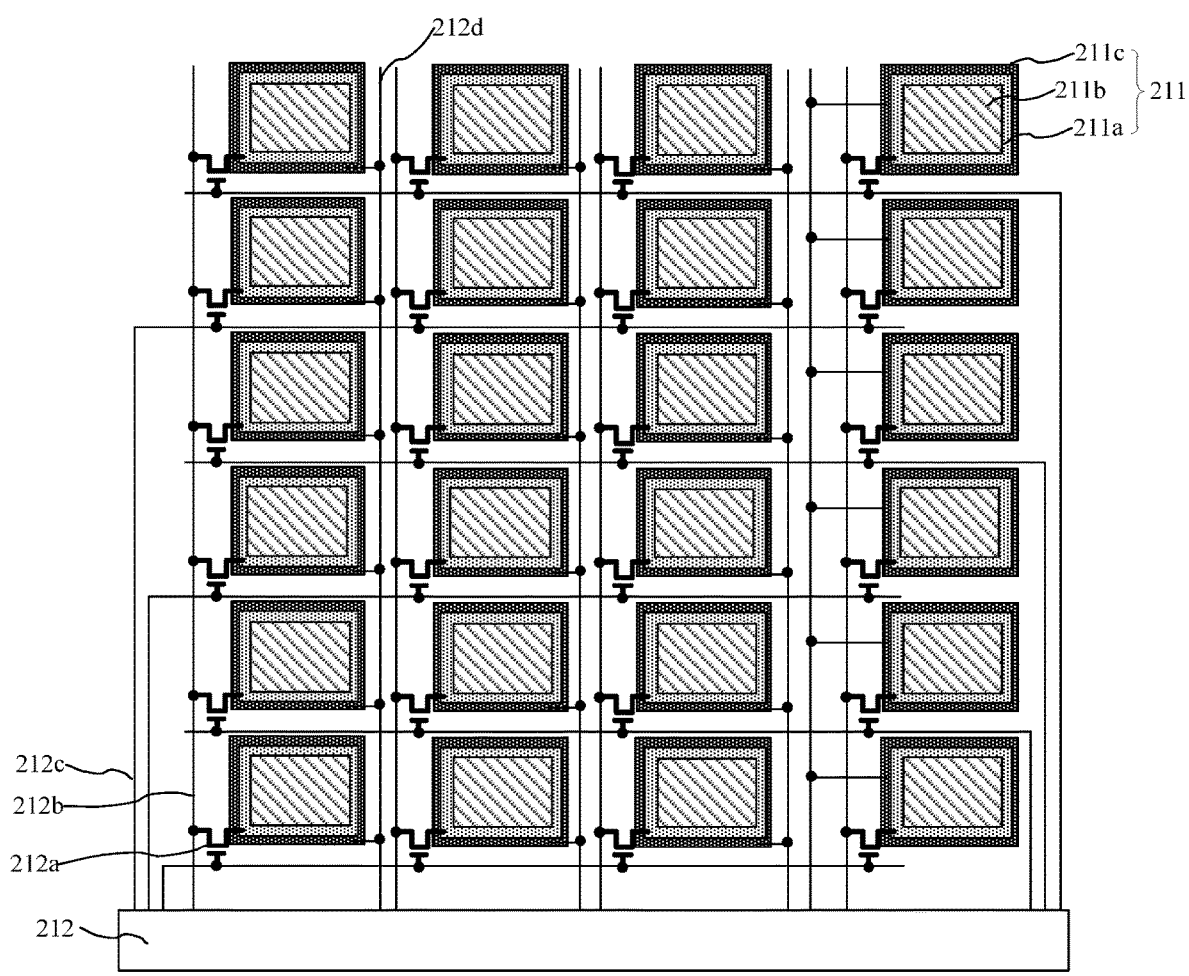
FIG. 6 is a schematic diagram of a photoelectric detection layer according to an embodiment of the present disclosure.

Referring to FIG. 6, FIG. 6 is a schematic diagram of a photoelectric detection layer according to an embodiment of the present disclosure. As shown in FIG. 6, the photoelectric detection layer 210 further includes a photoelectric detection circuit 212, and the photoelectric detection circuit 212 independently controls whether the photoelectric detection structure 211 works or not. Alternatively, the photoelectric detection structure 211 further includes a first switch device 212a; the second substrate 200 further includes a plurality of first source lines 212b and a plurality of first gate lines 212c that are insulated from each other; a control end of the first switch device 212a is electrically connected to the first gate line 212c, a first end of the first switch device 212a is electrically connected to the first source line 212b, and a second end of the first switch device 212a is electrically connected to the third electrode 211a. It can be understood that the up-and-down positional relationship between the electrodes and the photoelectric conversion module of the photoelectric detection structure in FIG. 6 is turned only for example, and the actual up-and-down positional relationship therebetween is as shown in FIG. 1. Alternatively, the second substrate 200 further includes bias voltage lines 212d; each of the fourth electrodes 211c is electrically connected to the bias voltage lines 212d.

In the present embodiment, in the photoelectric detection phase, the light source structure 111 emits light, and the photoelectric conversion module 211b in the photoelectric detection structure 211 generates a photoelectric reaction according to a received light signal. It can be understood that magnitudes of the light signals received by different photoelectric conversion modules 211b are different, and thus different photoelectric conversion modules 211b generate different photoelectric reactions. The photoelectric detection circuit 212 provides a bias voltage signal to each of the fourth electrodes 211c through the bias voltage lines 212d, then the first switch devices 212a are turned on row by row through the first gate lines 212c, and current signals of third electrodes 211a are read through the first source lines 212b. These current signals are the current signals flowing through photoelectric conversion modules 211b. The photoelectric detection circuit 212 acquires the current signal of each of the photoelectric detection structures 211 and a position of a droplet may be determined according to magnitudes of the current signals.

It can be understood that the light emitted by the light source structure needs to enter the photoelectric conversion module. Therefore, the electrodes, the insulating layer, and the dielectric layer between the electroluminescence module of the light source structure and the photoelectric conversion module should be made of corresponding light-transmitting materials for film formation.

In other embodiments, alternatively, the fourth electrode may be electrically connected to the second end of the first switch device, and the third electrode may be electrically connected to the bias voltage signal line.

Based on the structure of the preceding microfluidic device, a working process of the microfluidic device includes a droplet driving phase and a photoelectric detection phase, and the photoelectric detection phase includes a position detection sub-phase. A detection method of the microfluidic device includes steps described below.

In the droplet driving phase, the light source structure is controlled not to emit light, and different voltages are applied to the driving electrodes so that an electric field is generated between adjacent driving electrodes to drive a droplet to move in the microfluidic channel layer according to a preset movement path.

In the position detection sub-phase, the light source structure is controlled to emit light, each of the photoelectric detection structures is turned on at different times to output an electrical signal, and the droplet is positioned according to the electrical signal output by each of the photoelectric detection structures.

In the droplet driving phase, the light source layer does not work, and the photoelectric detection layer does not work. Referring to FIG. 4, it is assumed that a droplet is currently located at a position of a driving electrode a, and a movement direction of the droplet is along the Y direction, that is, the a-b-c direction. Then the droplet driving process is as follows: the driving circuit applies a higher voltage to a driving electrode b than that applied to the driving electrode a, and usually a voltage difference required for the droplet to move is 20 V, that is, the voltage difference between voltages applied to the driving electrode b and the driving electrode a is greater than or equal to 20 V; then an electric field penetrating the droplet is formed between the driving electrode a and the driving electrode b, this electric field makes a contact angle between the droplet above the driving electrode b and an insulating hydrophobic layer smaller and makes a contact angle between the droplet above the driving electrode a and the insulating hydrophobic layer basically not change. Since a contact angle difference between both sides of the droplet becomes greater, a voltage difference in the Y direction is generated inside the droplet, which drives the droplet to move towards the driving electrode b. By analogy, in a case where the droplet is located above the driving electrode b, a higher voltage is applied to the driving electrode c than that applied to the driving electrode b. In a same principle as the preceding, the droplet moves towards the driving electrode c, and by analogy, the droplet keeps moving along a setting direction of electrodes.

In the position detection sub-phase, both the light source layer and the photoelectric detection layer work, where a drive timing sequence in the driving electrode layer is stable and does not change, and thus the droplet keeps its current position still. The light source control circuit controls each of the light source structures to emit light synchronously, and the photoelectric detection circuit provides a bias voltage signal to each of the fourth electrodes through the bias voltage lines, then the first switch devices are turned on row by row through the first gate lines so that each of the photoelectric detection structures is turned on at different times to output an electrical signal, and then the current signal of each of the third electrodes is read through the first source line. This current signal is the current signal flowing through the photoelectric conversion module. Intensity of the light emitted by the light source structure after passing through the droplet is different from that of the light emitted by the light source structure without passing through the droplet, and the photoelectric detection circuit achieves the positioning for the droplet according to the electrical signals output by each of the photoelectric detection structures.

It can be understood that the working process of the microfluidic device may perform droplet driving for multiple frames consecutively and then perform position detection once in among to detect whether the droplet moves to a preset position. Alternatively, the working process of the microfluidic device may perform the position detection sub-phase once to position the droplet, and afterwards perform the droplet driving phase again. Alternatively, the working process of the microfluidic device may be that after the droplet moves for two or three times, performing the position detection once to detect whether the droplet moves along a preset path.

Alternatively, the photoelectric detection phase may further include a spectral analysis sub-phase; in the spectral analysis sub-phase, the light source structures that is configured to emit light in a first wavelength band, in an area where the droplet is located, are controlled to emit light, the photoelectric detection structures in the area where the droplet is located are controlled to be turned on sequentially, and a spectral analysis in first wavelength band is performed on the droplet according to the electrical signals output by the photoelectric detection structures. In a case where a spectral analysis is performed on the droplet, firstly the position detection sub-phase needs to be performed so that the position of the droplet is located, and then the spectral analysis sub-phase is performed so that the light source structures in the area where the droplet is located are controlled to emit light in a timing sequence and thus the spectral detection of the droplet is achieved.

Specifically, in the spectral analysis sub-phase, the light source structures that is configured to emit light in a first wavelength band, in the area where the droplet is located, are controlled to emit light at the same time, then the photoelectric detection structures in the area where the droplet is located are controlled to be turned on sequentially, and thus the electrical signals output by the photoelectric detection structures are only related to spectrum in a first wavelength band so that the spectral analysis in a first wavelength band of the droplet is achieved according to the electrical signals output by the photoelectric detection structures. For example, if light in the first wavelength band is red, a spectral analysis of the droplet in red is achieved.

If the spectral analysis also needs to be performed on green light in the area where the droplet is located, the light source structures that emit green lights in the area where the droplet is located are controlled to emit light at a same time, and the photoelectric detection structures in the area where the droplet is located are controlled to be turned on sequentially so that a green spectral analysis of the droplet is achieved according to the electrical signals output by the photoelectric detection structures.

Figure 7:
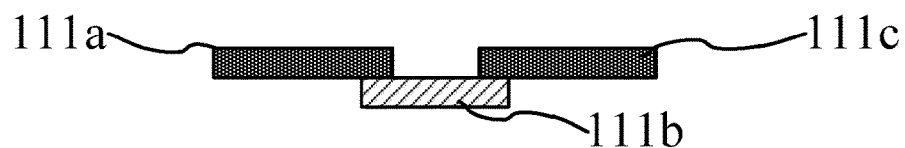
FIG. 7 is a schematic diagram of a light source structure according to an embodiment of the present disclosure.

Referring to FIG. 7, FIG. 7 is a schematic diagram of a light source structure according to an embodiment of the present disclosure. As shown in FIG. 7, the first electrode 111a and the second electrode 111c are arranged in a same layer and insulated, the electroluminescence module 111b is arranged between the first electrode 111a and the microfluidic channel layer, and the electroluminescence module 111b includes a micro light-emitting diode. The difference between the microfluidic device shown in the present embodiment and the microfluidic device shown in FIG. 1 is turned only in the type of the light source structure, and the working principles thereof are similar, which will not be repeated herein.

As shown in FIG. 7, the first electrode 111a and the second electrode 111c are arranged in the same layer and insulated, the electroluminescence module 111b is arranged between the first electrode 111a and the microfluidic channel layer, and the electroluminescence module 111b includes a micro light-emitting diode. The first electrode 111a and the second electrode 111c of the light source structure are arranged in a same layer and insulated, and the electroluminescence module 111b is electrically connected to the first electrode 111a and the second electrode 111c, respectively. Specifically, the electroluminescence module 111b is arranged on one side surface of the first electrode 111a facing the microfluidic channel layer, where the first electrode 111a and the second electrode 111c are both bulk electrodes. Alternatively, the second electrode 111c may be electrically connected to a common voltage signal line. Alternatively, the first electrode 111a may be electrically connected to a light source driving chip through a switch transistor. The light source driving chip controls the switch transistor to be turned on or off to control whether to energize the first electrode 111a or not.

In other embodiments, the light source structure may also be of other types such as OLED, LED, or quantum dot light-emitting device, which is not limited to the preceding examples. The OLED is taken as an example, as shown in FIG. 1, the first electrode and the second electrode are arranged on both sides of an OLED module, the first electrode and the second electrode provide electrons and holes to the OLED module, respectively, and thus the OLED module is electroluminescent; in this case, the first electrode and the second electrode are disposed oppositely and overlapped. The principle of the LED light-emitting device and the principle of the quantum dot light-emitting device are the same as the related art, which will not be repeated herein.

In embodiments of the present disclosure, the light source structure of the first substrate is served as a light source generating structure, the light emitted by the light source structure enters the photoelectric detection structure of the second substrate through the microfluidic channel layer, the photoelectric conversion module of the photoelectric detection structure generates a photoelectric reaction according to the intensity of the received light, and then the photoelectric detection structure outputs an electrical signal. The intensity of the light received by the photoelectric conversion module at a droplet position is different from that of the light received by the photoelectric conversion module at a non-droplet position. In such a way, according to different electrical signals of the photoelectric detection structures, the position of the droplet or whether the droplet reaches a preset position is determined so that the real-time droplet positioning and droplet position detection can be achieved. In embodiments of the present disclosure, the light source structure generates light for droplet detection, hence there is no limitation on an environment where it is used. Moreover, the microfluidic channel layer is disposed between the first substrate and the second substrate, and the droplet moves in an sealed and clean microfluidic channel layer. Hence, the detection accuracy would not be affected by the environment where it is used, thereby improving the detection success rate and the detection accuracy.

Based on the basic structure of the preceding microfluidic device, the microfluidic device provided in embodiments of the present disclosure includes at least two types. In the first type of microfluidic device, one light source structure is disposed corresponding to one photoelectric detection structure. In the second type of microfluidic device, a plurality of light source structures are disposed corresponding to one photoelectric detection structure.

Figure 8:
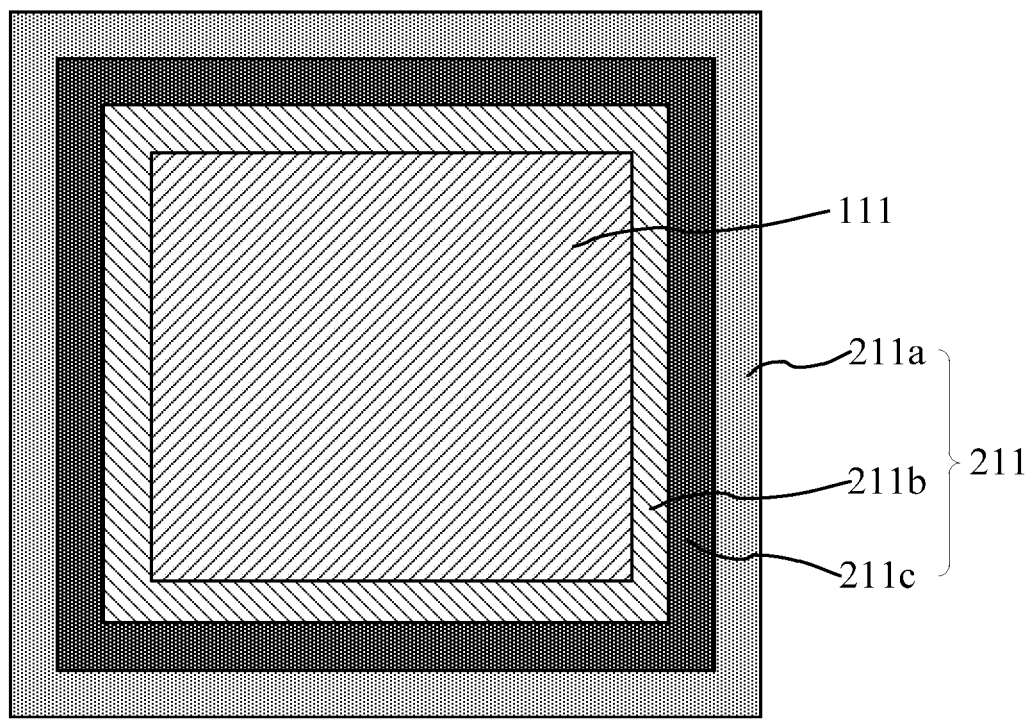
FIG. 8 is a top view of one light source structure and one photoelectric detection structure.

The present embodiment provides the first type of microfluidic device. FIG. 8 is a top view of one light source structure and one photoelectric detection structure.

Figure 9:
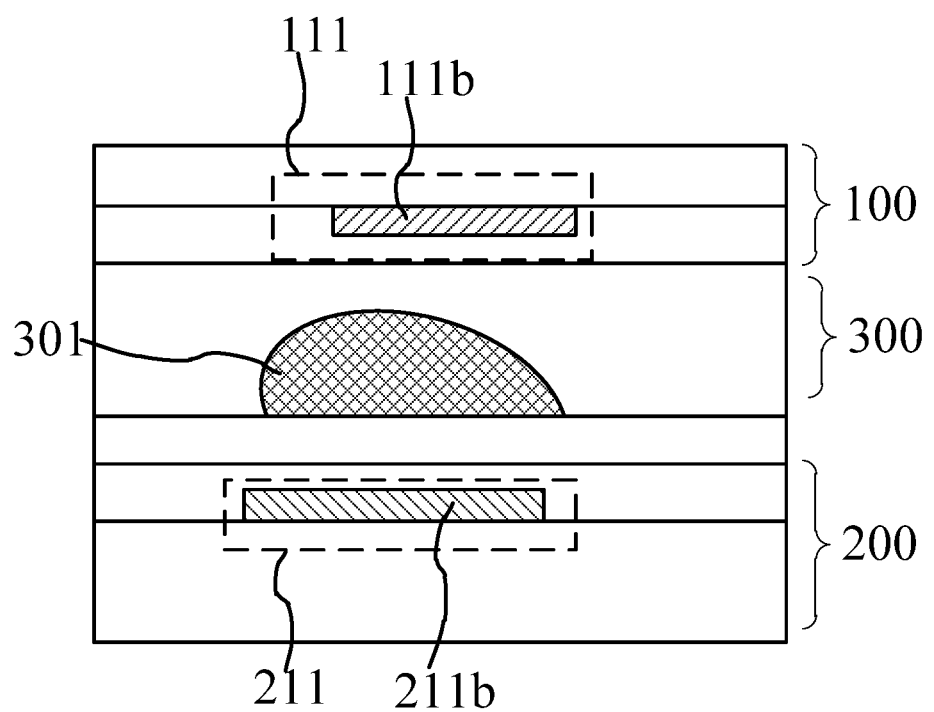
FIG. 9 is a first partial schematic diagram of a microfluidic device according to an embodiment of the present disclosure.

Referring to FIG. 9, FIG. 9 is a partial schematic diagram of a microfluidic device according to an embodiment of the present disclosure. One light source structure 111 is disposed corresponding to one photoelectric detection structure 211; in the direction perpendicular to the second substrate 200, an orthographic projection of the electroluminescence module 111b overlaps with an orthographic projection of the photoelectric conversion module 211b. FIG. 9 shows only part of a film structure in the microfluidic device. In the direction perpendicular to the second substrate 200, the orthographic projection of the electroluminescence module 111b overlaps with the orthographic projection of the photoelectric conversion module 211b, and thus the light emitted by the light source structure 111 may be emitted to the photoelectric conversion module 211b, so that the photoelectric conversion module 211b generates a photoelectric reaction, and the droplet position detection and the spectral detection are achieved according to a photoelectric detection result.

Figure 10:
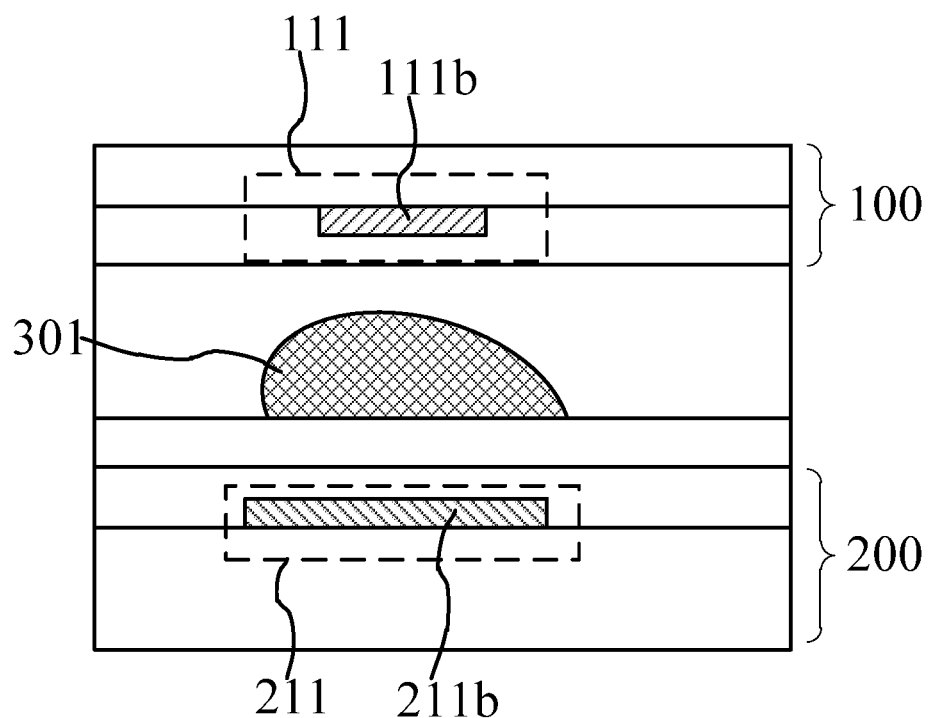
FIG. 10 is a second partial schematic diagram of a microfluidic device according to an embodiment of the present disclosure.

Referring to FIG. 10, FIG. 10 is a partial schematic diagram of a microfluidic device according to an embodiment of the present disclosure. Alternatively, in the direction perpendicular to the second substrate 200, the orthographic projection of the electroluminescence module 111b is located within the orthographic projection of the photoelectric conversion module 211b. Then the photoelectric conversion module 211b may receive the light emitted by the corresponding light source structure 111, and the light emitted by an adjacent light source structure 111 cannot be emitted to this photoelectric conversion module 211b. In such a way, an impact of the adjacent light source structure 111 on the photoelectric detection structure 211 may be reduced, and the problem of crosstalk between adjacent photoelectric conversion modules 211b caused by light path scattering of the light source structure 111 may be alleviated.

Alternatively, the microfluidic device has an independent driving electrode layer. For a microfluidic device in which one light source structure is disposed corresponding to one photoelectric detection structure and an independent driving electrode layer is provided, the detection method includes: a position detection sub-phase, the light source layer includes a light source control circuit, and the light source control circuit is configured to control the light source structures to be turned on at a same time and controlling the photoelectric detection structures of the photoelectric detection layer to be turned on at different times and output electrical signals for droplet positioning. In the spectral analysis sub-phase, light source control circuit is configured to control the light source structures in the area where the droplet is located, the light source structures that emit lights in a same wavelength band are turned on at a same time and light source structures that emit lights in different wavelength bands are turned on at different times. The photoelectric detection structures in the area where the droplet is located are controlled to be turned on at different times and to output electrical signals for spectral detection.

The driving electrode layer is arranged between the photoelectric detection layer and the microfluidic channel layer 300, and alternatively, in the direction perpendicular to the second substrate 200, an orthographic projection of the driving electrode 221 overlaps with an orthographic projection of the electroluminescence module 111b.

Figure 11:
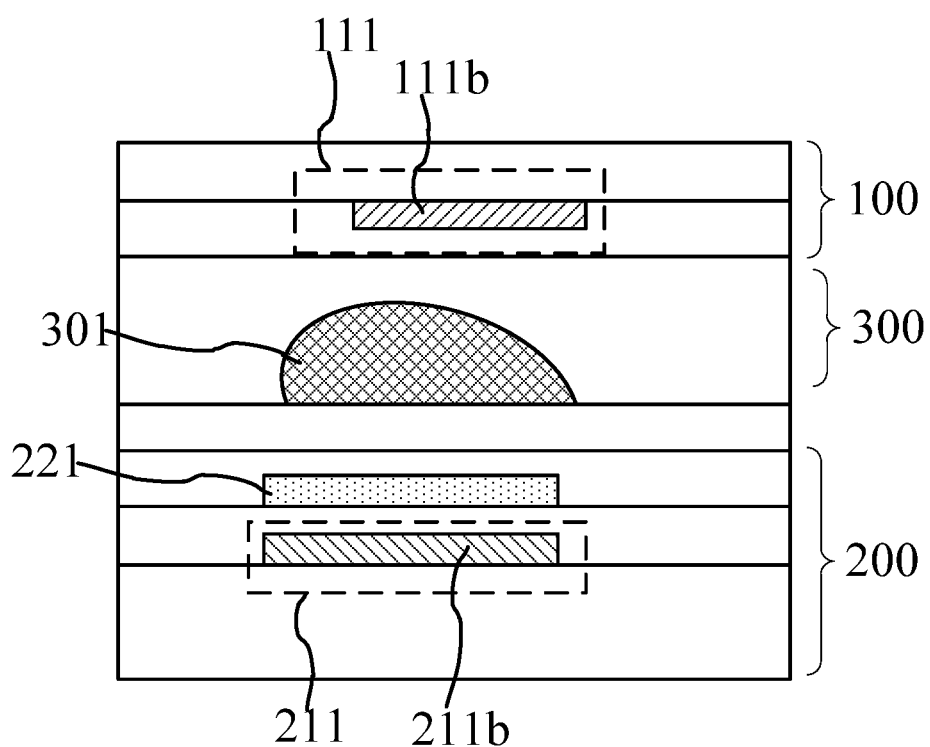
FIG. 11 is a third partial schematic diagram of a microfluidic device according to an embodiment of the present disclosure.

Referring to FIG. 11, FIG. 11 is a partial schematic diagram of a microfluidic device according to an embodiment of the present disclosure. As shown in FIG. 11, one driving electrode 221 is disposed corresponding to one light source structure 111; in the direction perpendicular to the second substrate 200, the orthographic projection of the driving electrode 221 overlaps with the orthographic projection of the electroluminescence module 111b.

Figure 12:
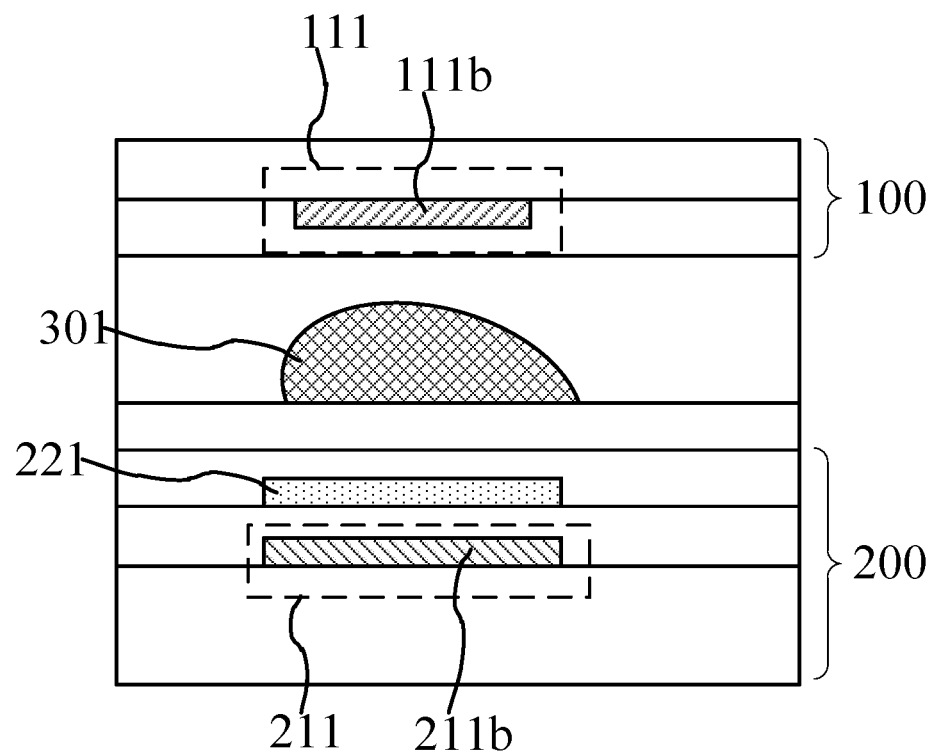
FIG. 12 is a fourth partial schematic diagram of a microfluidic device according to an embodiment of the present disclosure.
Figure 13:
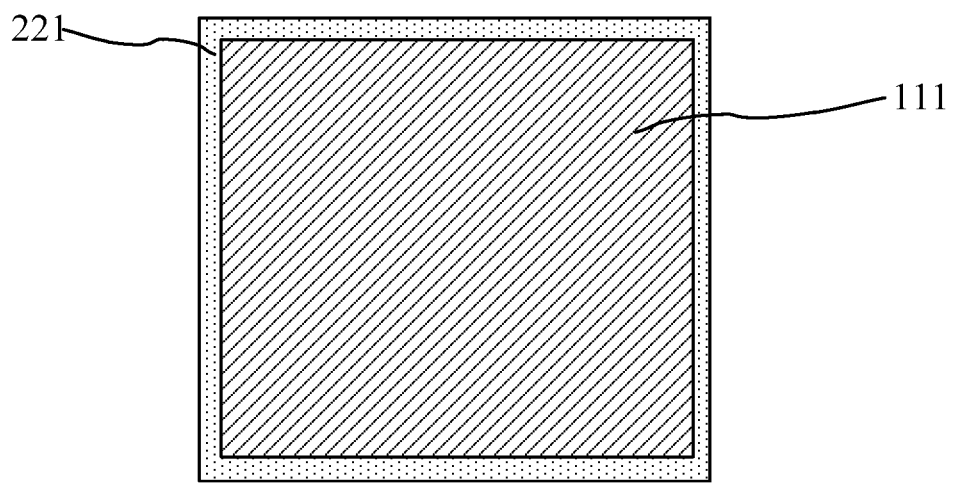
FIG. 13 is a top view of a driving electrode and a light source structure according to an embodiment of the present disclosure.

Alternatively, referring to FIG. 12, FIG. 12 is a partial schematic diagram of a microfluidic device according to an embodiment of the present disclosure. Referring to FIG. 13, FIG. 13 is a top view of a driving electrode and a light source structure according to an embodiment of the present disclosure. As shown in FIGS. 12 and 13, in the direction perpendicular to the second substrate 200, the orthographic projection of the electroluminescence module 111b is located within the orthographic projection of the driving electrode 221.

The orthographic projection of the driving electrode 221 at least partially overlaps with the orthographic projection of the electroluminescence module 111b on the second substrate 200, so that an orthographic projection of the droplet 301 located above the driving electrode 221 on the second substrate 200 inevitably overlaps with the orthographic projection of the electroluminescence module 111b, hence there would be no missed detections or false detections and the like.

Figure 14:
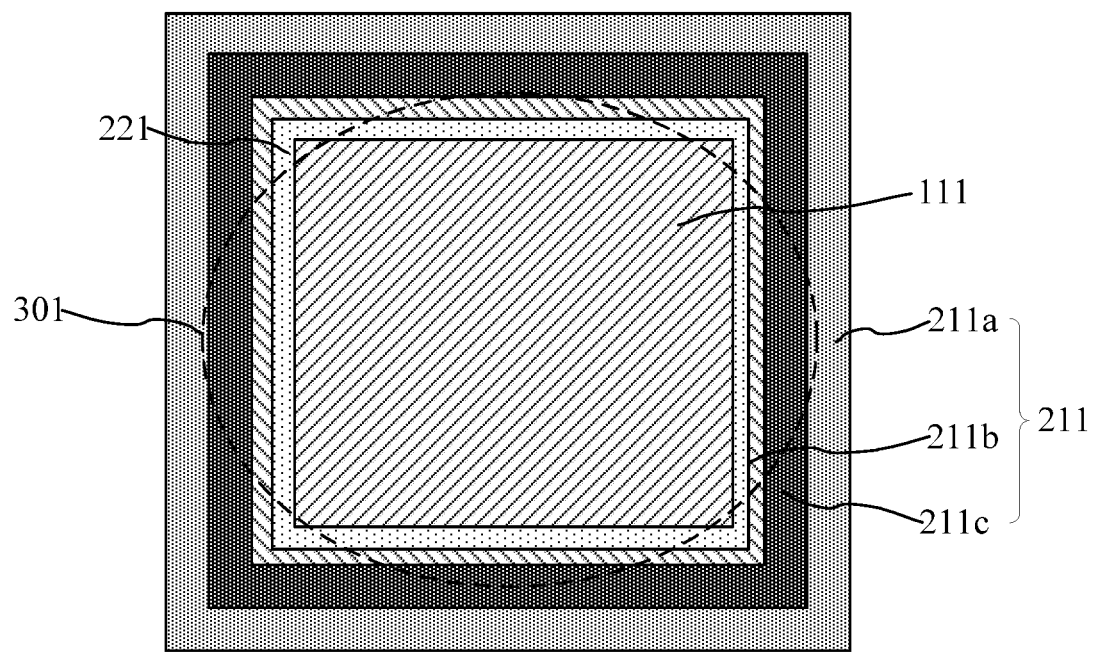
FIG. 14 is a top view of a driving electrode and a droplet according to an embodiment of the present disclosure.

Referring to FIG. 14, FIG. 14 is a top view of a driving electrode and a droplet according to an embodiment of the present disclosure. As shown in FIG. 14, alternatively, the droplet 301 in the microfluidic channel layer 300 is a small droplet with a size similar to that of the light source structure 111. Then the detection method of the microfluidic device is described below.

In the droplet driving phase, neither the light source structure nor the photoelectric detection structure is turned on. The driving electrode layer drives the driving electrodes 221 row by row and column by column to control the droplet 301 to move according to a preset path.

Figure 15:
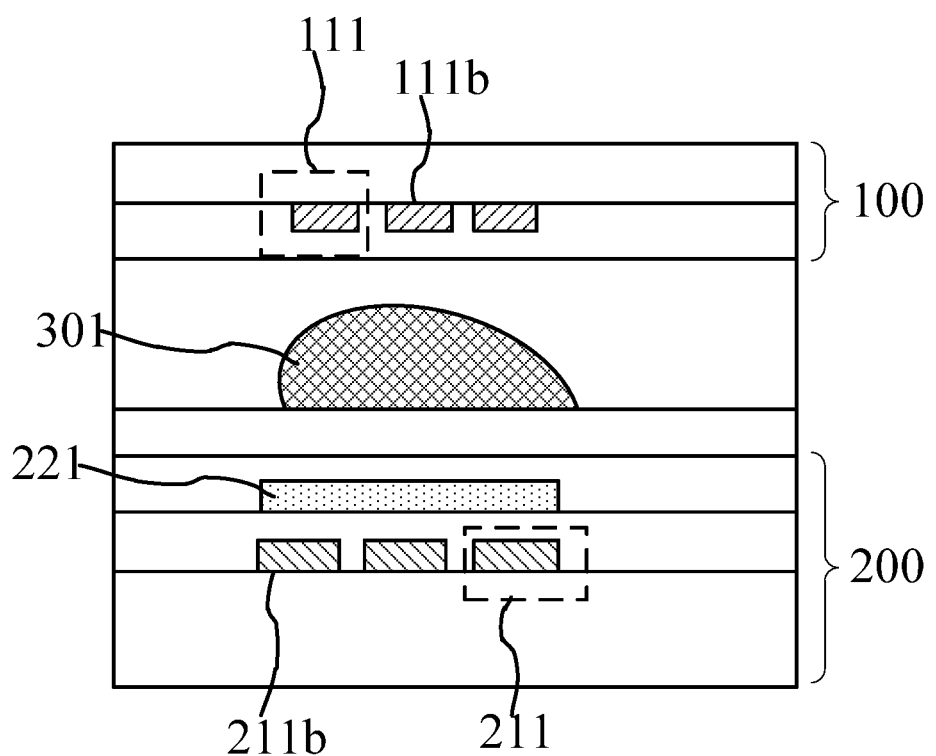
FIG. 15 is a fifth partial schematic diagram of a microfluidic device according to an embodiment of the present disclosure.
Figure 16:
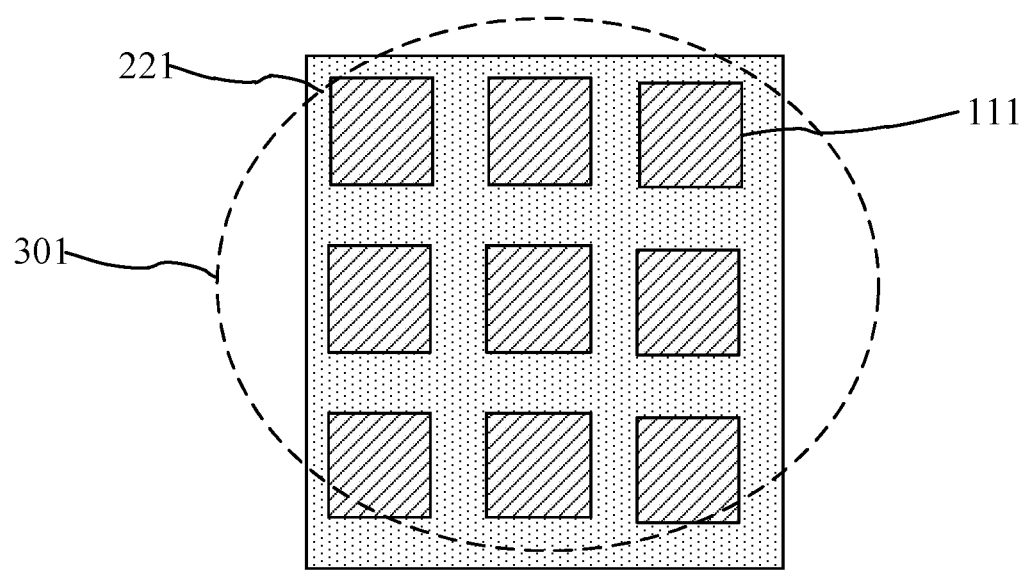
FIG. 16 is a top view of a driving electrode and a light source structure according to an embodiment of the present disclosure.

Referring to FIG. 15, FIG. 15 is a partial schematic diagram of a microfluidic device according to an embodiment of the present disclosure. As shown in FIG. 15, the driving electrode layer is arranged between the photoelectric detection layer and the microfluidic channel layer 300. Referring to FIG. 16, FIG. 16 is a top view of a driving electrode and a light source structure according to an embodiment of the present disclosure. As shown in FIGS. 15 and 16, alternatively, one driving electrode 221 is disposed corresponding to m light source structures 111, where m is a positive integer greater than 1; in the direction perpendicular to the second substrate 200, the orthographic projection of the driving electrode 221 overlaps with orthographic projections of m electroluminescence modules 111b. The orthographic projection of the driving electrode 221 on the second substrate 200 covers a plurality of electroluminescence modules 111b, so that the orthographic projection of the droplet 301 located above the driving electrode 221 on the second substrate 200, inevitably overlaps with the orthographic projection of the electroluminescence module 111b.

Alternatively, the droplet 301 in the microfluidic channel layer 300 has a size similar to that of the driving electrode 221. In this case, one droplet 301 may cover a plurality of light source structures 111. Then the detection method of the microfluidic device is described below.

In the droplet driving phase, neither the light source structure nor the photoelectric detection structure is turned on. The driving electrode layer drives the driving electrodes 221 row by row and column by column to control the droplet 301 to move according to a preset path.

Figure 17:
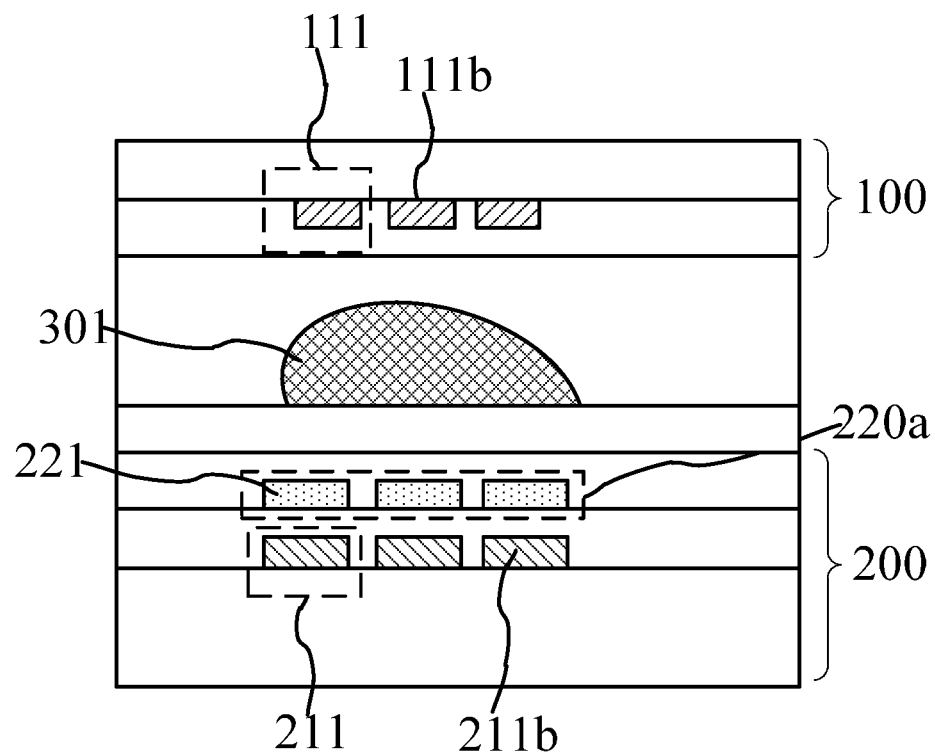
FIG. 17 is a sixth partial schematic diagram of a microfluidic device according to an embodiment of the present disclosure.
Figure 18:
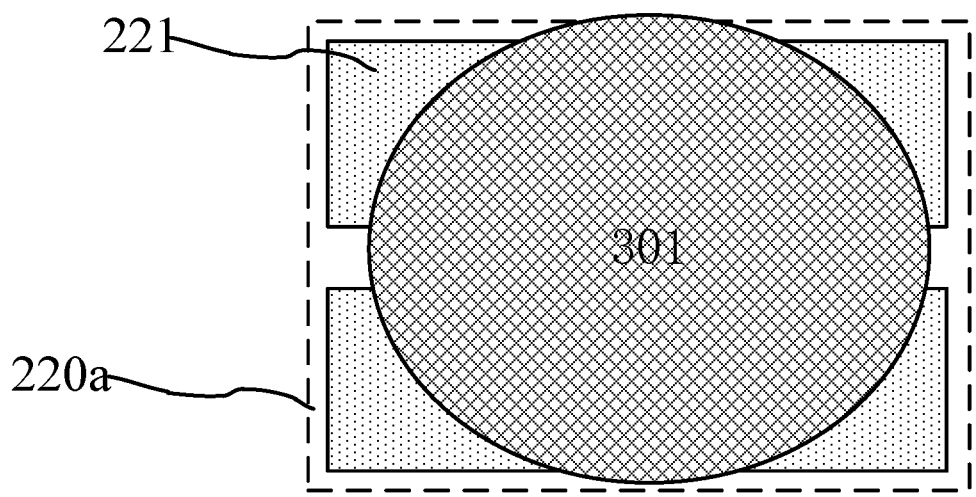
FIG. 18 is a top view of a driving electrode and a droplet according to an embodiment of the present disclosure.

Referring to FIG. 17, FIG. 17 is a partial schematic diagram of a microfluidic device according to an embodiment of the present disclosure. As shown in FIG. 17, the driving electrode layer is arranged between the photoelectric detection layer and the microfluidic channel layer 300. Referring to FIG. 18, FIG. 18 is a top view of a driving electrode and a droplet according to an embodiment of the present disclosure. As shown in FIGS. 17 and 18, alternatively, the driving electrode layer includes a plurality of driving electrode units 220a, and the driving electrode unit 220a includes n driving electrodes 221, where n is a positive integer greater than 1. The driving circuit is configured to control a same voltage applied to each driving electrode 221 in the driving electrode unit 220a, and control a voltage difference between voltages applied to two adjacent driving electrode units 220a to be greater than or equal to a droplet movement threshold voltage such that the droplet 301 moves in the microfluidic channel. Alternatively, in the direction perpendicular to the second substrate 200, the orthographic projection of the driving electrode unit 220a covers orthographic projections of a plurality of electroluminescence modules 111b of the light source structure 111.

Alternatively, the droplet 301 in the microfluidic channel layer 300 is a large droplet with a size similar to that of n driving electrodes 221. In this case, one droplet 301 may cover a plurality of light source structures 111 and cover n driving electrodes 221. Accordingly, the driving electrode layer is divided into a plurality of driving electrode units 220a according to the size of the droplet 301, and each driving electrode unit 220a includes n driving electrodes 221. Based on this, the driving circuit takes the driving electrode unit 220a as a droplet displacement unit and controls the droplet 301 to move from a driving electrode unit 220a to an adjacent driving electrode unit 220a.

In the droplet driving phase, neither the light source structure nor the photoelectric detection structure is turned on. The driving circuit applies a same voltage to each driving electrode 221 in the driving electrode unit 220a, and applies different voltages to two adjacent driving electrode units 220a, and the voltage difference therebetween is greater than or equal to a droplet movement threshold voltage, so that the droplet 301 may move in the microfluidic channel from one driving electrode unit 220a to the adjacent driving electrode unit 220a.

The microfluidic device provided above is able to identify and feed back the position of the droplet in real time, with high detection accuracy, and is able to achieve the spectral analysis of the droplet in a simple structure and at a low cost, as no external laser device is needed to be carried.

Alternatively, in the microfluidic device. an electrode structure in the photoelectric detection layer may be multiplexed as an electrode structure in the driving electrode layer. For a microfluidic device in which one light source structure is disposed corresponding to one photoelectric detection structure and the third electrode is multiplexed as the driving electrode, the detection method includes a position detection sub-phase, the light source layer includes a light source control circuit, and the light source control circuit is configured to control the light source structures to be turned on at a same time and control the photoelectric detection structures of the photoelectric detection layer to be turned on at different times and to output electrical signals for droplet positioning. In the spectral analysis sub-phase, the light source control circuit is configured to control the light source structures in the area where the droplet is located, the light source structures that is configured to emit light in a first wavelength band, are turned on at a same time and the photoelectric detection structures, in the area where the droplet is located, are turned on at different times and output electrical signals for spectral detection in the first wavelength band.

Figure 19:
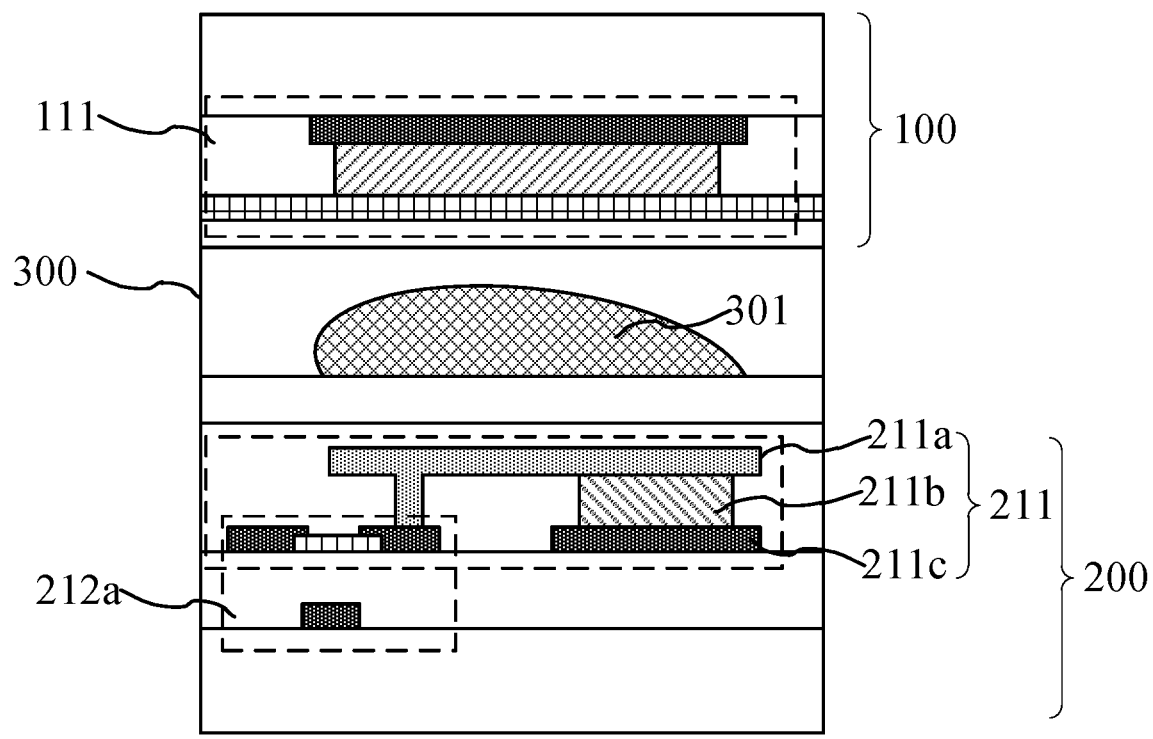
FIG. 19 is a seventh partial schematic diagram of a microfluidic device according to an embodiment of the present disclosure.

Referring to FIG. 19, FIG. 19 is a partial schematic diagram of a microfluidic device according to an embodiment of the present disclosure. As shown in FIG. 19, the third electrode 211a is arranged between the fourth electrode 211c and the microfluidic channel layer 300, and the third electrode 211a is multiplexed as the driving electrode. With reference to FIG. 6, the photoelectric detection structure 211 is correspondingly electrically connected to one first switch device 212a, the driving circuit is multiplexed as the photoelectric detection circuit.

As shown in FIG. 19, the droplet 301 in the microfluidic channel layer 300 is a small droplet with a size similar to that of the light source structure 111. Alternatively, the driving circuit is configured to control the photoelectric detection structures to be turned on at different times to apply voltages to the third electrodes such that the droplet moves in the microfluidic channel. That is, the photoelectric detection circuit 212 drives the third electrodes 211a row by row and column by column to control the droplet 301 to move according to a preset path. In the droplet driving phase, neither the light source structure nor the photoelectric detection structure is turned on. The photoelectric detection circuit 212 controls the first switch devices 212a to be turned on row by row through the first gate lines 212c. In this case, the first source lines 212b serve as drive signal transmission lines and apply voltages to the third electrodes 211a column by column through the first source lines 212b so that the droplet 301 is driven to move according to the principle of electrowetting.

Figure 20:
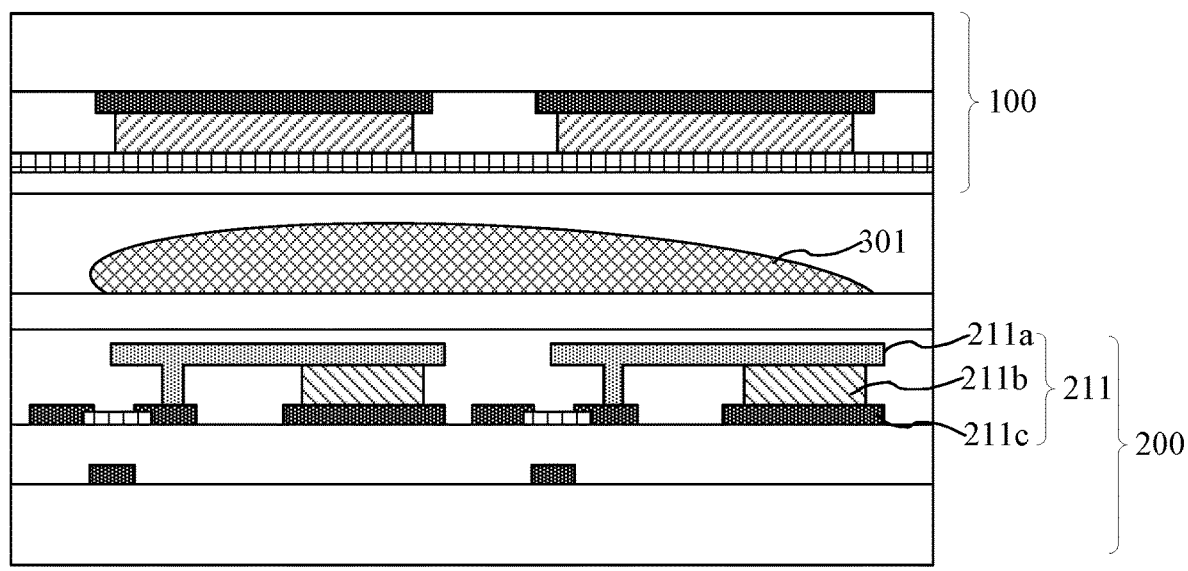
FIG. 20 is a schematic diagram of a microfluidic device according to an embodiment of the present disclosure.
Figure 21:
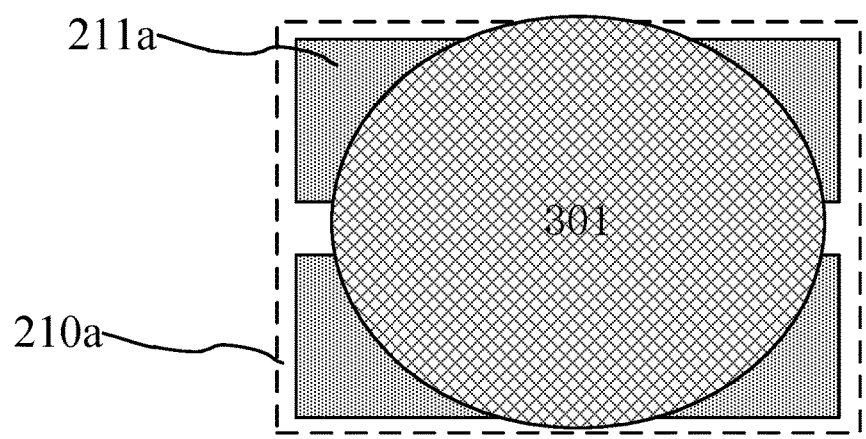
FIG. 21 is a top view of a driving electrode and a droplet.

Referring to FIG. 20, FIG. 20 is a schematic diagram of a microfluidic device according to an embodiment of the present disclosure, and FIG. 21 is a top view of a driving electrode and a droplet. As shown in FIGS. 20 and 21, the droplet 301 in the microfluidic channel layer 300 is a large droplet with a size similar to n third electrodes 211a so that the photoelectric detection circuit drives the droplet 301 in a manner of the photoelectric detection unit 210a to control the droplet 301 to move according to a preset path, where the photoelectric detection unit 210a includes n third electrodes 211a.

Alternatively, the photoelectric detection layer includes a plurality of photoelectric detection units 210a, and the photoelectric detection unit 210a includes n photoelectric detection structures 211, where n is a positive integer greater than 1; the driving circuit is configured to control n photoelectric detection structures 211 in each photoelectric detection unit 210a to be turned on at a same time to apply a same voltage to the third electrode 211a, and the driving circuit is further configured to control a voltage difference between voltages applied to two adjacent photoelectric detection units 210a, the voltage difference is greater than or equal to the droplet movement threshold voltage such that the droplet 301 moves in the microfluidic channel.

As described above, the size of the third electrode 211a is relatively small, and the size of the droplet 301 is relatively large and covers n third electrodes 211a. In such a way, the photoelectric detection circuit takes a photoelectric detection unit 210a as a droplet displacement unit to control the droplet to move from one photoelectric detection unit 210a to an adjacent photoelectric detection unit 210a.

In the spectral analysis sub-phase, after the positioning for the droplet 301 is completed, the light source structure 111 above the droplet 301 is controlled to emit light, and the photoelectric detection circuit 212 controls the first gate line 212c at the position where the droplet 301 is located to output an electrical signal so that the first switch device 212a is turned on. In this case, the first source line 212b serves as a signal reading line, and the electrical signal of the third electrode 211a at the position where the droplet 301 is located is read through the first source line 212b so that photoelectric detection is achieved.

The microfluidic device provided above is able to identify and feed back the position of the droplet in real time, with high detection accuracy, and is able to achieve the spectral analysis of the droplet in a simple structure and at a low cost, as no external laser device is needed to be carried, and is able to achieve a thinner microfluidic device.

Figure 22:
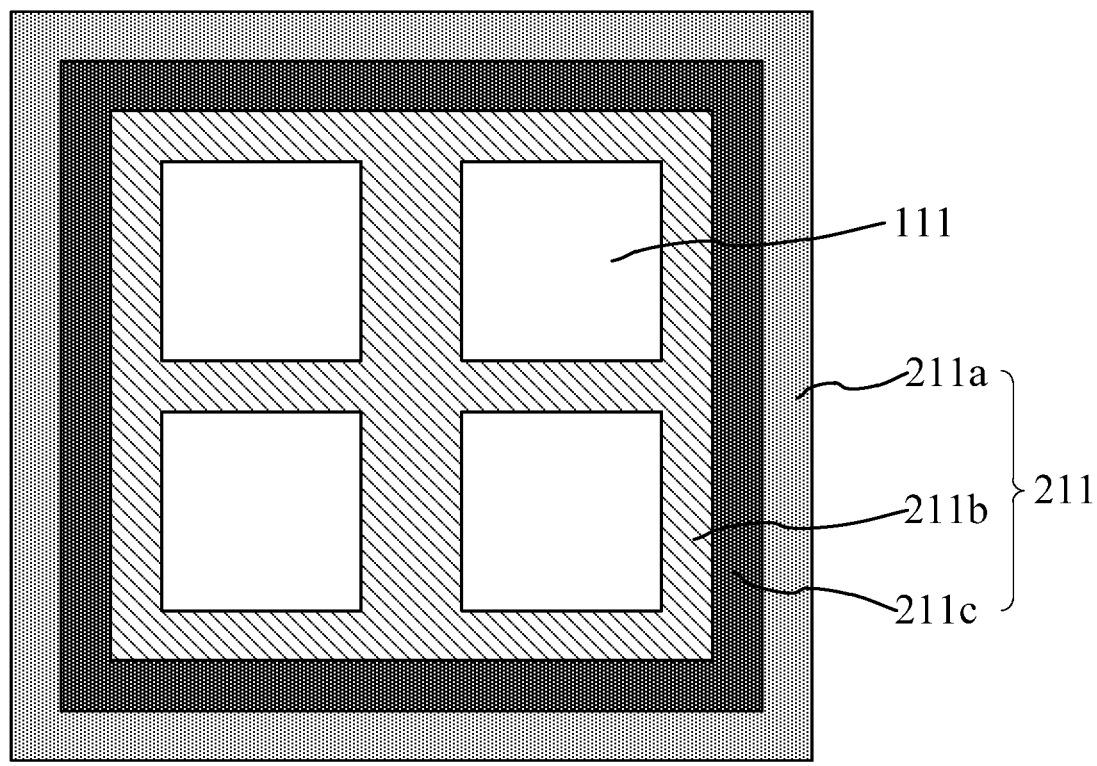
FIG. 22 is a top view of a plurality of light source structures and one photoelectric detection structure.

The present embodiment provides the second type of microfluidic device. FIG. 22 is a top view of a plurality of light source structures and one photoelectric detection structure.

Figure 23:
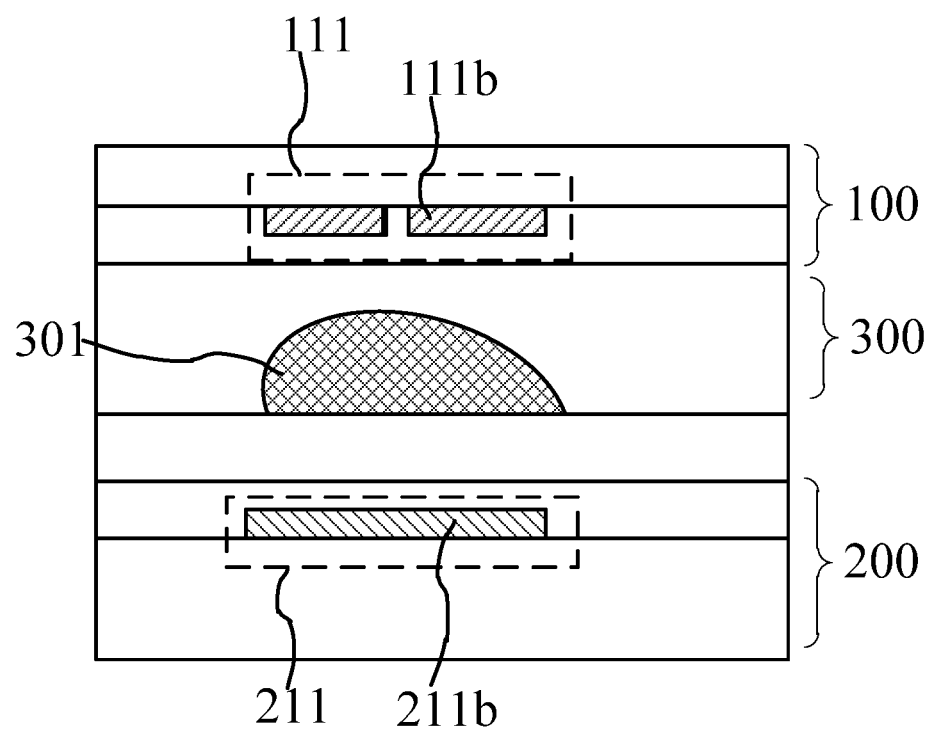
FIG. 23 is an eighth partial schematic diagram of a microfluidic device according to an embodiment of the present disclosure.

Referring to FIG. 23, FIG. 23 is a partial schematic diagram of a microfluidic device according to an embodiment of the present disclosure. A plurality of light source structures 111 are disposed corresponding to one photoelectric detection structure 211; in the direction perpendicular to the second substrate 200, the orthographic projection of one photoelectric conversion module 211b covers the orthographic projections of the plurality of electroluminescence modules 111b. FIG. 23 shows only partial of the film layer structure in the microfluidic device. In the direction perpendicular to the second substrate 200, the orthographic projection of the photoelectric conversion module 211b covers the orthographic projections of the plurality of electroluminescence modules 111b, and thus the light emitted by the light source structure 111 may be emitted to the photoelectric conversion module 211b so that the photoelectric conversion module 211b generates a photoelectric reaction and the droplet position detection and spectral detection are achieved according to a photoelectric detection result.

Alternatively, the microfluidic device has an independent driving electrode layer.

Figure 24:
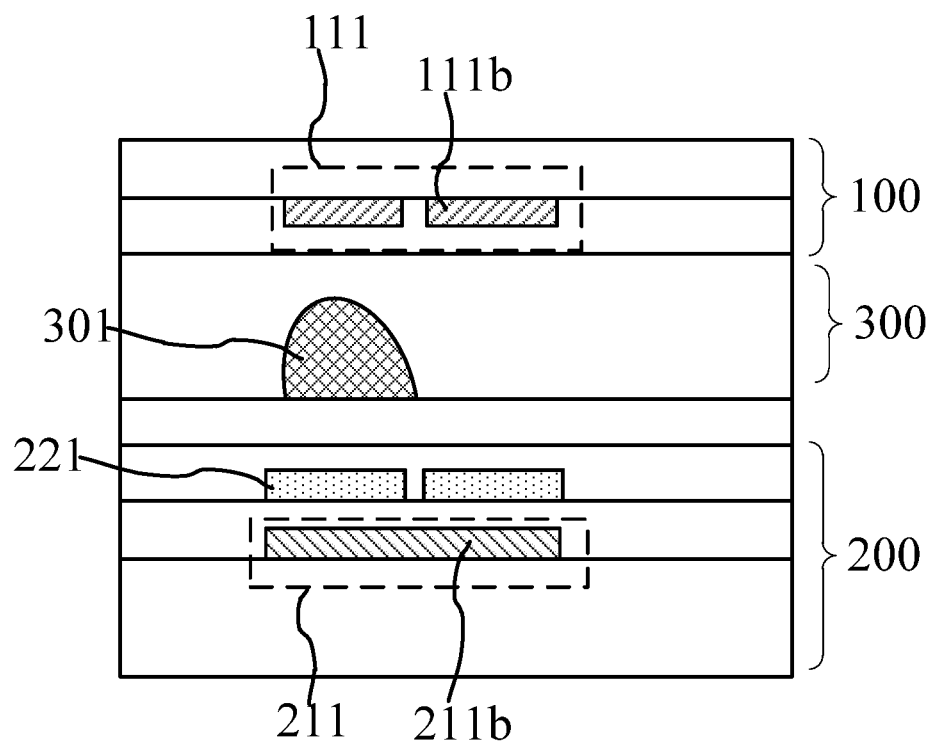
FIG. 24 is a ninth partial schematic diagram of a microfluidic device according to an embodiment of the present disclosure.

Referring to FIG. 24, FIG. 24 is a partial schematic diagram of a microfluidic device according to an embodiment of the present disclosure. As shown in FIG. 24, the driving electrode layer is arranged between the photoelectric detection layer and the microfluidic channel layer 300. Alternatively, one driving electrode 221 is disposed corresponding to one light source structure 111; in the direction perpendicular to the second substrate 200, the orthographic projection of the driving electrode 221 overlaps with the orthographic projection of the electroluminescence module 111b. Then the orthographic projection of the droplet 301 located above the driving electrode 221 on the second substrate 200 overlaps with the orthographic projection of the electroluminescence module 111b, and the light emitted by the light source structure 111 may pass through the droplet 301.

If the droplet 301 in the microfluidic channel layer 300 is a small droplet with a size similar to the size of the light source structure 111, in the droplet driving phase, neither the light source structure 111 nor the photoelectric detection structure 211 is turned on and the driving electrode layer drives the driving electrodes 221 row by row and column by column to control the droplet 301 to move according to a preset path.

Figure 25:
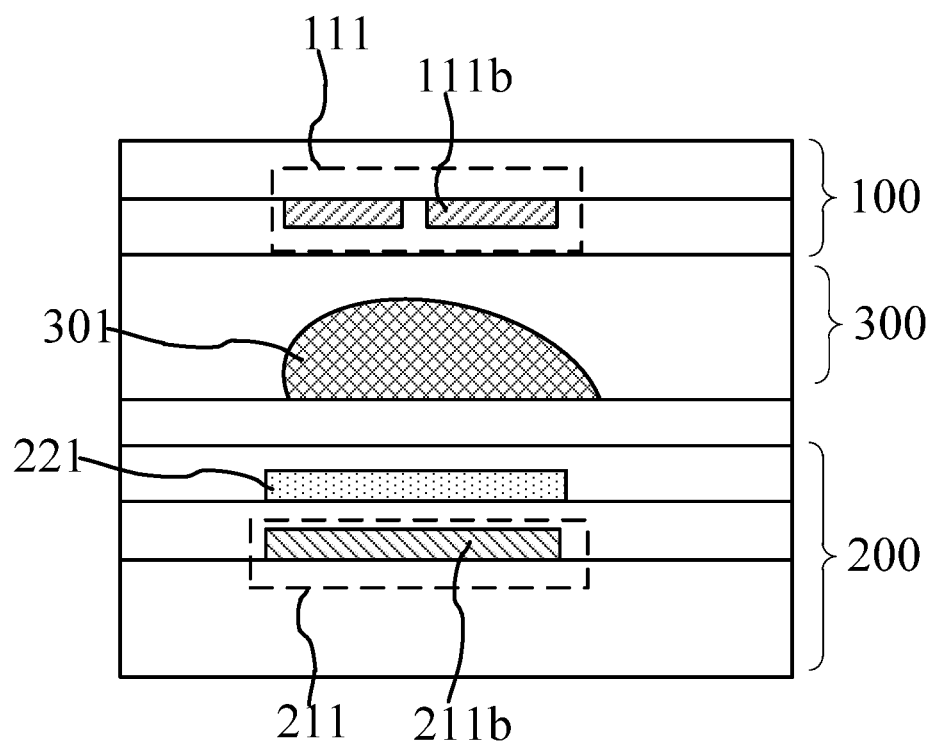
FIG. 25 is a tenth partial schematic diagram of a microfluidic device according to an embodiment of the present disclosure.

Referring to FIG. 25, FIG. 25 is a partial schematic diagram of a microfluidic device according to an embodiment of the present disclosure. As shown in FIG. 25, the driving electrode layer is arranged between the photoelectric detection layer and the microfluidic channel layer 300. Alternatively, one driving electrode 221 is disposed corresponding to k light source structures 111, where k is a positive integer greater than 1; in the direction perpendicular to the second substrate 200, the orthographic projection of the driving electrode 221 overlaps with the orthographic projections of k electroluminescence modules 111b. Alternatively, the droplet 301 in the microfluidic channel layer 300 is a droplet with a size similar to the size of the driving electrode 221. In this case, one droplet 301 may cover a plurality of light source structures 111. Then in the droplet driving phase, neither the light source structure nor the photoelectric detection structure is turned on, and the driving electrode layer drives the driving electrodes 221 row by row and column by column to control the droplet 301 to move according to a preset path.

Figure 26:
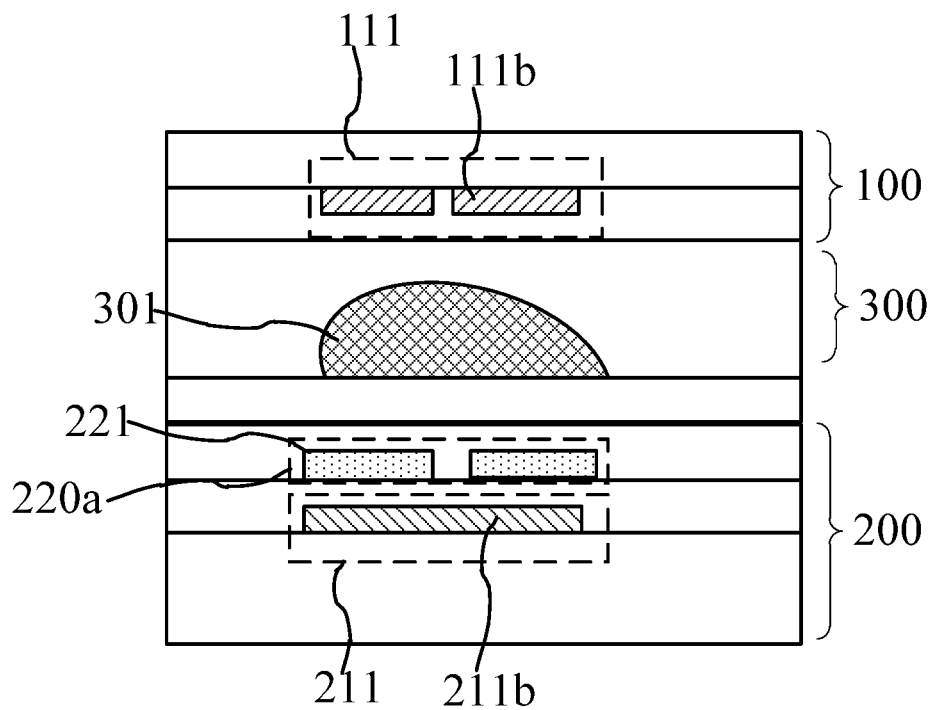
FIG. 26 is an eleventh partial schematic diagram of a microfluidic device according to an embodiment of the present disclosure.
Figure 27:
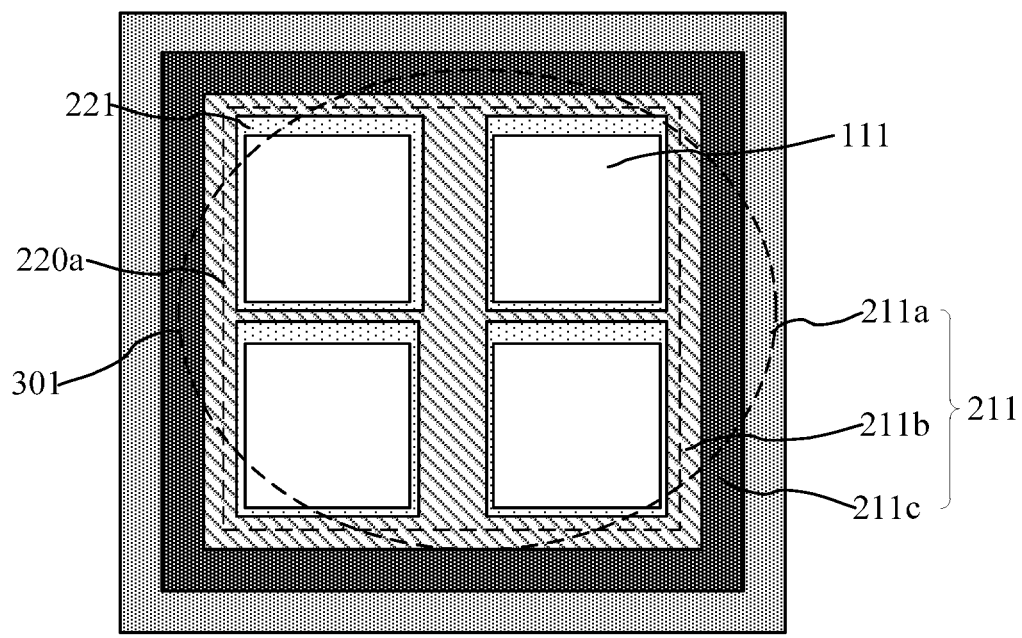
FIG. 27 is a top view of a driving electrode and a droplet according to an embodiment of the present disclosure.

Referring to FIG. 26, FIG. 26 is a partial schematic diagram of a microfluidic device according to an embodiment of the present disclosure. As shown in FIG. 26, the driving electrode layer is arranged between the photoelectric detection layer and the microfluidic channel layer 300. Referring to FIG. 27, FIG. 27 is a top view of a driving electrode and a droplet according to an embodiment of the present disclosure. As shown in FIGS. 26 and 27, alternatively, the driving electrode layer includes a plurality of driving electrode units 220a, and the driving electrode unit 220a includes y driving electrodes 221, where y is a positive integer greater than 1; the driving circuit is configured to control a same voltage to be applied to each driving electrode 221 in the driving electrode unit 220a, and the driving circuit is further configured to control a voltage difference between voltages applied to two adjacent driving electrode units 220a, the voltage difference is greater than or equal to the droplet movement threshold voltage, such that the droplet 301 moves in the microfluidic channel.

Alternatively, the droplet 301 in the microfluidic channel layer 300 is a large droplet with a size similar to a size of y driving electrodes 221. In this case, one droplet 301 may cover a plurality of light source structures 111 and cover y driving electrodes 221. Accordingly, the driving electrode layer is divided into a plurality of driving electrode units 220a according to the size of the droplet 301, and each driving electrode unit 220a includes y driving electrodes 221. Based on this, the driving circuit takes one driving electrode unit 220a as a droplet displacement unit and controls the droplet 301 to move from a driving electrode unit 220a to an adjacent driving electrode unit 220a.

In the droplet driving phase, neither the light source structure nor the photoelectric detection structure is turned on. The driving circuit applies a same voltage to each driving electrode 221 in the driving electrode unit 220a, and applies voltages to two adjacent driving electrode units 220a with a voltage difference, which therebetween is greater than or equal to the droplet movement threshold voltage, so that the droplet 301 may move in the microfluidic channel from one driving electrode unit 220a to the adjacent driving electrode unit 220a.

The microfluidic device provided above is able to identify and feed back the position of the droplet in real time, with high detection accuracy, and is able to achieve the spectral analysis of the droplet in a simple structure and at a low cost, as no external laser device is needed to be carried.

Alternatively, the electrode structure in the photoelectric detection layer may be multiplexed as the driving electrode layer of the microfluidic device. For a microfluidic device in which a plurality of light source structures are disposed corresponding to one photoelectric detection structure and the third electrode may be multiplexed as the driving electrode, the detection method includes a position detection sub-phase, the light source layer includes a light source control circuit, and the light source control circuit is configured to control a plurality of light source structures corresponding to one photoelectric detection structure to be turned on at different times and control the photoelectric detection structures to be turned on at different times and to output a plurality of electrical signals for droplet positioning. In the spectral analysis sub-phase, the light source control circuit is configured to control the light source structures in the area where the droplet is located such that the light source structures that emit lights in a same wavelength band are turned on at a same time and the light source structures that emit lights in different wavelength bands are turned on at different times and the photoelectric detection structures in the area where the droplet is located are controlled to be turned on at different times and to output electrical signals for spectral detection.

Figure 28:
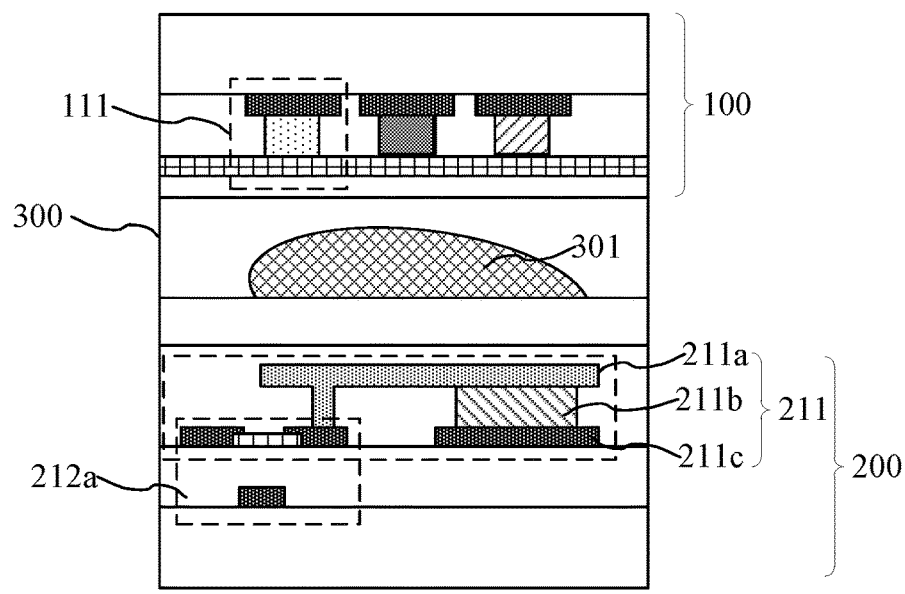
FIG. 28 is a twelfth partial schematic diagram of a microfluidic device according to an embodiment of the present disclosure.
Figure 29:
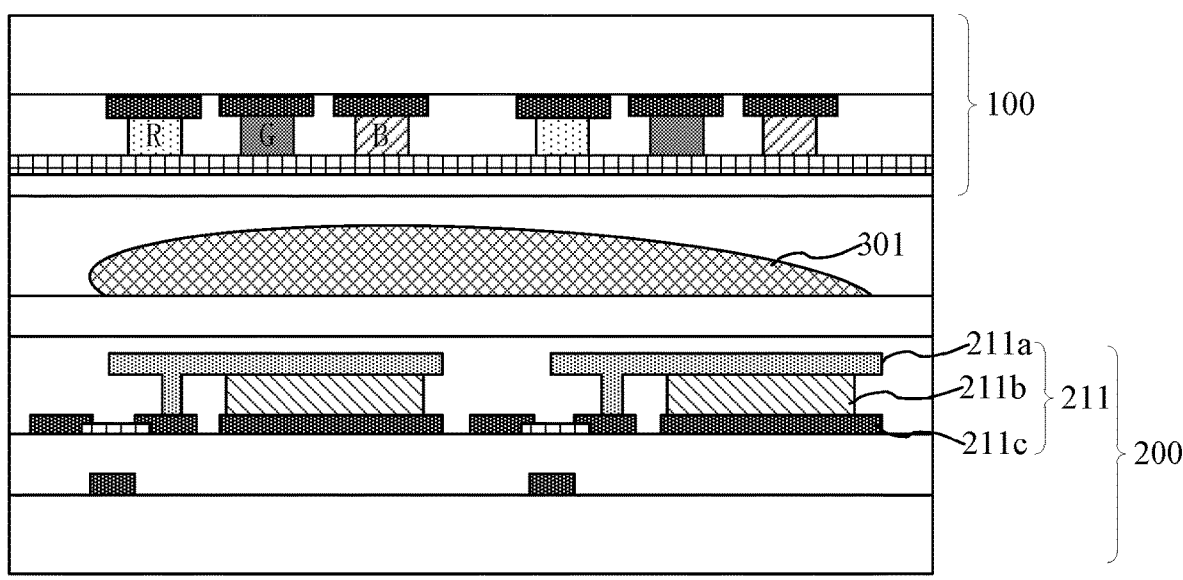
FIG. 29 is a thirteenth partial schematic diagram of a microfluidic device according to an embodiment of the present disclosure.

Referring to FIGS. 28 and 29, FIGS. 28 and 29 are two partial schematic diagrams of a microfluidic device according to an embodiment of the present disclosure. The third electrode 211a is arranged between the fourth electrode 211c and the microfluidic channel layer 300, and the third electrode 211a is multiplexed as a driving electrode.

As shown in FIG. 28, the droplet 301 in the microfluidic channel layer 300 is a small droplet with a size similar to that of the photoelectric detection structure 211. Alternatively, the driving circuit is configured to control the photoelectric detection structures to be turned on at different times to apply voltages to the third electrodes such that the droplet moves in the microfluidic channel. That is, the photoelectric detection circuit 212 drives the third electrodes 211a row by row and column by column to control the droplet 301 to move according to a preset path.

As shown in FIG. 29, the droplet 301 in the microfluidic channel layer 300 is a large droplet with a size similar to n third electrodes 211a so that the photoelectric detection circuit drives the droplet 301 in a manner of the photoelectric detection unit 210a to control the droplet 301 to move according to a preset path, where the photoelectric detection unit 210a includes n third electrodes 211a.

With reference to FIG. 6, the photoelectric detection structure 211 is correspondingly electrically connected to one first switch device 212a, the driving circuit is multiplexed as the photoelectric detection circuit. In the droplet driving phase, neither the light source structure nor the photoelectric detection structure is turned on. The photoelectric detection circuit 212 controls the first switch devices 212a to be turned on through the first gate lines 212c. In this case, the first source lines 212b serve as drive signal transmission lines and apply voltages to the third electrodes 211a through the first source lines 212b so that the droplet 301 is driven to move according to the principle of electrowetting.

In the spectral analysis sub-phase, after the positioning for the droplet 301 is completed, the light source structure 111 above the droplet 301 is controlled to emit light, and the photoelectric detection circuit 212 controls the first gate line 212c at the position where the droplet 301 is located to output an electrical signal so that the first switch device 212a is turned on. In this case, the first source line 212b serves as a signal reading line, and the electrical signal of the third electrode 211a at the position where the droplet 301 is located is read through the first source line 212b so that photoelectric detection is achieved.

The microfluidic device provided above is able to identify and feed back the position of the droplet in real time, with high detection accuracy, and is able to achieve the spectral analysis of the droplet in a simple structure and at a low cost, as no external laser device is needed to be carried, and is able to achieve a thinner microfluidic device.

Based on any of the preceding embodiments, embodiments of the present disclosure further provide a detection method of the microfluidic device. The microfluidic device is the microfluidic device described in any of the preceding embodiments. The working process of this microfluidic device includes a droplet driving phase and a photoelectric detection phase. The photoelectric detection phase includes a position detection sub-phase. The detection method includes steps below.

In the position detection sub-phase, the light source structure is controlled to emit light, each photoelectric detection structure is turned on at different times to output an electrical signal, and the droplet is positioned according to the electrical signal output by each photoelectric detection structure.

In the droplet driving phase, the light source structure is controlled not to emit light, and different voltages are applied to driving electrodes so that an electric field is generated between adjacent driving electrodes to drive the droplet to move in the microfluidic channel layer according to a preset movement path.

The microfluidic device in which the third electrode is multiplexed as the driving electrode as shown in FIG. 19 is taken as an example and the working process of the microfluidic device is described in conjunction with the detection method.

A first substrate of the microfluidic device is integrated with a light source structure, where a first electrode of the light source structure is a metal electrode and a second electrode of the light source structure is an ITO transparent electrode so that it can be ensured that light is irradiated towards a second substrate. Alternatively, the size of the metal electrode is greater than or equal to the size of an electroluminescence module. The metal electrode may serve as an anode, the ITO transparent electrode may serve as a cathode, and an ITO voltage of the first substrate is set to 0 V or a negative voltage, which is beneficial for a driving electrode layer to drive the droplet. A photoelectric reaction triggered by the light irradiated to the photoelectric conversion module of the second substrate in a case the light emitted by the light source structure passes through the droplet, is different from that in a case the light emitted by the light source structure does not pass through the droplet. By detecting the change of the current passing through the photoelectric conversion module, whether a droplet exists at this position is determined. Alternatively, the photoelectric conversion module includes a PIN active layer. The size of the light source structure may be tens of microns, and the size of the photoelectric detection structure is usually at a millimeter level so the center position of the photoelectric detection structure may be irradiated by a relatively small light source structure, and thus crosstalk caused by light path scattering can be avoided.

The third electrode of the second substrate controls droplet driving and spectral detection through TFT. In other embodiments, alternatively, the third electrode may control droplet driving and spectral detection through switch devices such as a-Si/LTPS/IGZO. The fourth electrode, the source line, the source electrode, and the drain electrode in the second substrate may all be made of metal at the same layer.

In the droplet driving phase, alternatively, the droplet is basically as big as the driving electrode, so that drive signals may be input to the third electrodes row by row and column and column, and thus the droplet is driven to move according to the principle of electrowetting. In this phase, a same low voltage may be applied to the first electrode and the second electrode of the light source structure so that the light source structure is controlled not to emit light; a low voltage may be applied to the fourth electrode of the photoelectric detection structure, where the voltage difference between the voltages applied to the third electrode and the fourth electrode should be not less than the droplet movement threshold voltage.

In the position detection sub-phase, a high voltage is applied to the anode of the light source structure and a low voltage is applied to the cathode of the light source structure so that the light source structure emits light, and the light emitted by the light source structure enters the photoelectric detection structure of the second substrate through the microfluidic channel layer. In this phase, a low voltage is applied to the fourth electrode of the photoelectric detection structure, the photoelectric detection structures are turned on row by row and column by column, and the electrical signals of the third electrodes are read. In such a way, the position of the droplet is determined according to the electrical signal of each of the third electrodes. Alternatively, a work cycle of the microfluidic device includes at least one frame of refreshing picture, and one frame of refreshing picture includes at least two droplet driving phases and at least one photoelectric detection phase. Alternatively, the position detection is performed each time after the droplet moves, or, the position detection is performed once after the droplet moves for n times, which may be set by relevant practitioners according to specific needs.

Alternatively, the photoelectric detection phase may further include a spectral analysis sub-phase; in the spectral analysis sub-phase, the light source structures that emit lights in a first wavelength band, in the area where the droplet is located, are controlled to emit light, the photoelectric detection structures in the area where the droplet is located are controlled to be turned on sequentially, and a spectral analysis in first wavelength band is performed on the droplet according to the electrical signals output by the photoelectric detection structures. Alternatively, a time period of the spectral analysis sub-phase and a time period of the position detection sub-phase at least partially overlap.

An effective method for analyzing substance composition in biochemical experiments is spectroscopy. A detection sample is irradiated with lights of different wavelengths and absorption of different lights by the sample is detected so that the substance composition may be identified. In the present embodiment, droplet spectral analysis may be achieved.

With reference to FIG. 29, one droplet 301 covers light source structures with three different colors so that in the spectral analysis sub-phase, the light source structures with three different colors, at the position where the droplet is located, emit light at different times, and light source structures with the same color emit light at a same time. For example, a light source structure emitting red light R emits light, and the photoelectric detection structure 211 is turned on and collects current under red light source; then a light source structure emitting green light G emits light, and the photoelectric detection structure 211 is turned on and collects current under green light source; and finally a light source structure emitting blue light B emits light, and the photoelectric detection structure 211 is turned on and collects current under blue light source. Therefore, each photoelectric detection structure 211 outputs currents corresponding to lights in three different wavelength bands, and according to current information in a same wavelength band of each photoelectric detection structure 211, the photoelectric detection circuit may determine the absorption by the droplet 301 in this wavelength band so that a spectrogram corresponding to this wavelength is obtained, and thus the spectrograms in three wavelength bands are obtained. The composition of the droplet 301 is determined according to the spectrograms in three different wavelength bands.

This spectral analysis technique is especially applicable to joint experiment for various types of droplet samples and to determining whether mixing is sufficient. In the present embodiment, alternatively, a spectral analysis area and a position detection area may be configured. A third electrode in the spectral analysis area is smaller than a third electrode in the position detection area so that the droplet in the spectral analysis area may cover a plurality of third electrodes and the droplet in the position detection area may cover one third electrode. In such a way, the number of signal lines can be reduced, and the difficulty of driving and detection is reduced.

Figure 30:
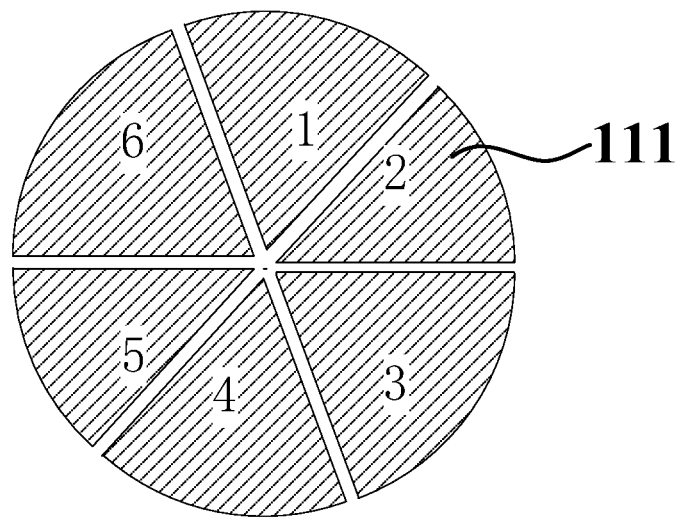
FIG. 30 is a schematic diagram of fan-shaped light source structures according to an embodiment of the present disclosure.
Figure 31:
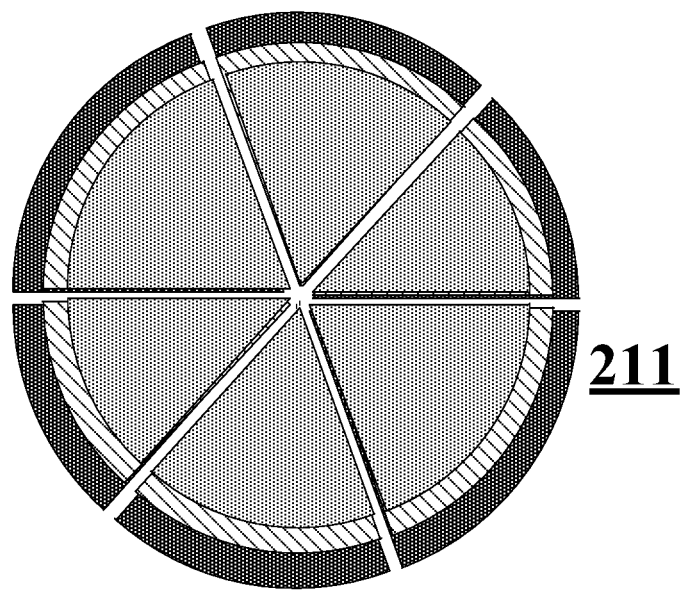
FIG. 31 is a schematic diagram of fan-shaped photoelectric detection structures according to an embodiment of the present disclosure.

It is to be noted that if in the spectral analysis sub-phase, there is a higher requirement for wavelength classification of the spectrum, more light source structures with different wavelengths may be added. A shape of the light source structure is not limited to a square shape. As shown in FIG. 30, alternatively, the light source structure 111 is six equal sectors divided from a circle, and forms a circular light source structure 111 with six different colors, which may include red 1, green 2, blue 3, yellow 4, purple 5, and orange 6. As shown in FIG. 31, FIG. 31 is a fan-shaped photoelectric detection structure 211 disposed corresponding to the fan-shaped light source structure, and the fan-shaped photoelectric detection structure 211 may be disposed corresponding to the shape of the light source structure.

Figure 32:
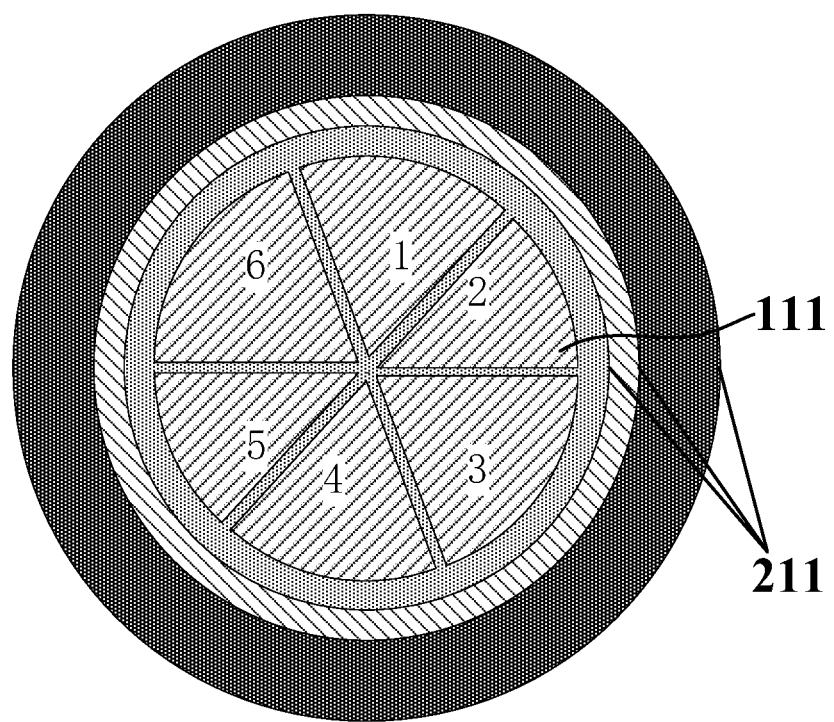
FIG. 32 illustrates a correspondence between photoelectric detection structures and light source structures according to an embodiment of the present disclosure.

In other embodiments, alternatively, as shown in FIG. 32, one light-emitting unit includes a plurality of light source structures 111 with different colors. One light-emitting unit may be disposed corresponding to one photoelectric detection structure 211, and the droplet may be slightly bigger than the third electrode (referring to 211a in FIG. 1) of the photoelectric detection structure 211. Then a plurality of light source structures 111 with different colors in one light-emitting unit emit light at different times sequentially. In such a way, the photoelectric detection structure 211 may obtain the electrical signals corresponding to the light source structures 111 with different colors at different times sequentially, and interference between colors caused by the light-emitting of the light source structures 111 with different colors can be avoided so that the purity of monochromatic light can be ensured.

In embodiments of the present disclosure, the light source structure of the first substrate is served as a light source generating structure, the light emitted by the light source structure enters the photoelectric detection structure of the second substrate through the microfluidic channel layer, the photoelectric conversion module of the photoelectric detection structure generates a photoelectric reaction according to an intensity of the received light, and then the photoelectric detection structure outputs an electrical signal. The intensity of the light received by the photoelectric conversion module at a droplet position is different from that of the light received by the photoelectric conversion module at a non-droplet position. In such a way, according to different electrical signals of the photoelectric detection structures, the position of the droplet or whether the droplet reaches a preset position is determined so that the droplet positioning and droplet position detection can be achieved.

It is to be noted that the preceding are only preferred embodiments of the present disclosure and the technical principles used therein. It will be appreciated by those skilled in the art that the present disclosure is not limited to the embodiments described herein. For those skilled in the art, various apparent modifications, adaptations, combinations, and substitutions can be made without departing from the scope of the present disclosure. Therefore, while the present disclosure has been described in detail via the preceding embodiments, the present disclosure is not limited to the preceding embodiments and may include more equivalent embodiments without departing from the inventive concept of the present disclosure. The scope of the present disclosure is determined by the scope of the appended claims.

What is claimed is:

1. A microfluidic device, comprising:
a first substrate and a second substrate that are disposed oppositely,
and a microfluidic channel layer arranged between the first substrate and the second substrate,
wherein the first substrate comprises a light source layer, the light source layer comprises a plurality of light source structures, the light source structure comprises a first electrode, a second electrode, and an electroluminescence module arranged between the first electrode and the second electrode, and in a case where the light source structure is turned on, the light source structure is configured to emit light passing through the microfluidic channel layer and irradiating the second substrate;
the second substrate comprises a photoelectric detection layer and a driving electrode layer, the photoelectric detection layer comprises a plurality of photoelectric detection structures, the photoelectric detection structure comprises a third electrode, a fourth electrode, and a photoelectric conversion module arranged between the third electrode and the fourth electrode, and the photoelectric detection structure generates an electrical signal according to an incident light signal in a case where the photoelectric detection structure is turned on; and
the driving electrode layer comprises a plurality of driving electrodes and a plurality of driving circuits, and the driving circuit is configured to apply a voltage to the driving electrode such that a droplet moves in a microfluidic channel of the microfluidic channel layer;
wherein one of the light source structures is disposed corresponding to one of the photoelectric detection structures; and
in a direction perpendicular to the second substrate, an orthographic projection of the electroluminescence module overlaps with an orthographic projection of the photoelectric conversion module; and
wherein the third electrode is arranged between the fourth electrode and the microfluidic channel layer, and the third electrode is multiplexed as the driving electrode, wherein the driving circuit is configured to control the photoelectric detection structures to be turn on at different times to apply a voltage to the third electrode such that the droplet moves in the microfluidic channel.

2. The microfluidic device of claim 1, wherein the first electrode and the second electrode are arranged in a same layer and insulated, the electroluminescence module is arranged between the first electrode and the microfluidic channel layer, and the electroluminescence module comprises a micro light-emitting diode.

3. The microfluidic device of claim 1, wherein the first electrode and the second electrode are arranged in a same layer and insulated, the electroluminescence module is arranged between the first electrode and the second electrode, and the electroluminescence module comprises an organic luminescent material.

4. The microfluidic device of claim 1, wherein in a case where the light source structure is turned on, the light source structure of the light source layer is configured to emit light in a first wavelength band; or
the light source layer comprises at least a first light source structure and a second light source structure, and the first light source structure is configured to emit light in a first wavelength band and the second light source structure is configured to emit light in a second wavelength band.

5. The microfluidic device of claim 1, wherein the photoelectric detection structure further comprises a first switch device;
the second substrate further comprises a plurality of first source lines and a plurality of first gate lines that are insulated from each other; and
a control end of the first switch device is electrically connected to the first gate line, a first end of the first switch device is electrically connected to the first source line, and a second end of the first switch device is electrically connected to the third electrode.

6. The microfluidic device of claim 5, wherein the second substrate further comprises a bias voltage line; and each the fourth electrode is electrically connected to the bias voltage line.

7. The microfluidic device of claim 1, wherein the driving electrode layer is arranged between the photoelectric detection layer and the microfluidic channel layer, wherein one of the driving electrodes is disposed corresponding to one of the light source structures; and
in the direction perpendicular to the second substrate, an orthographic projection of the driving electrode overlaps with the orthographic projection of the electroluminescence module;
or,
wherein one of the driving electrodes is disposed corresponding to m light source structures, wherein m is a positive integer greater than 1; and
in the direction perpendicular to the second substrate, an orthographic projection of the driving electrode overlaps with orthographic projections of m electroluminescence modules.

8. The microfluidic device of claim 7, wherein the driving electrode layer comprises a plurality of driving electrode units, and the driving electrode unit comprises n driving electrodes, wherein n is a positive integer greater than 1; and
the driving circuit is configured to control a same voltage to be applied to each the driving electrode in the driving electrode unit, and control a voltage difference between voltages to be applied to two adjacent driving electrode units to be greater than or equal to a droplet movement threshold voltage, such that the droplet moves in the microfluidic channel,
wherein in the direction perpendicular to the second substrate, the orthographic projection of the driving electrode unit covers orthographic projections of a plurality of electroluminescence modules of the light source structure.

9. The microfluidic device of claim 7, wherein the light source layer comprises a light source control circuit, and the light source control circuit is configured to control the light source structures to be turned on at a same time; and
the photoelectric detection structures of the photoelectric detection layer are configured to be turned on at different times and output electrical signals for droplet positioning;
wherein the light source control circuit is configured to control light source structures in an area where the droplet is located, light source structures that emit lights in a same wavelength band are turned on at a same time and light source structures that emit lights in different wavelength bands are turned on at different times; and
the photoelectric detection structures in the area where the droplet is located are configured to be turned on at different times and output electrical signals for spectral detection.

10. The microfluidic device of claim 1, wherein the photoelectric detection layer comprises a plurality of photoelectric detection units, and the photoelectric detection unit comprises n photoelectric detection structures, wherein n is a positive integer greater than 1; and
the driving circuit is configured to control the n photoelectric detection structures in the photoelectric detection unit to be turned on at a same time to apply a same voltage to the third electrode, and the driving circuit is further configured to control a voltage difference between voltages to be applied to two adjacent photoelectric detection units, the voltage difference is greater than or equal to a droplet movement threshold voltage, such that the droplet moves in the microfluidic channel.

11. The microfluidic device of claim 10, wherein the light source layer comprises a light source control circuit, and the light source control circuit is configured to control the light source structures to be turned on at a same time; and
the photoelectric detection structures of the photoelectric detection layer are turned on at different times and output electrical signals for droplet positioning; wherein the light source control circuit is configured to control the light source structures in an area where the droplet is located, light source structures that are configured to emits light in a first wavelength band are turned on at a same time; and
photoelectric detection structures in the area where the droplet is located are turned on at different times and output the electrical signals for spectral detection in a first wavelength band.

12. A microfluidic device, comprising:
a first substrate and a second substrate that are disposed oppositely,
and a microfluidic channel layer arranged between the first substrate and the second substrate,
wherein the first substrate comprises a light source layer, the light source layer comprises a plurality of light source structures, the light source structure comprises a first electrode, a second electrode, and an electroluminesce module arranged between the first electrode and the second electrode, and in a case where the light source structure is turned on, the light source structure is configured to emit light passing through the microfluidic channel layer and irradiating the second substrate;
the second substrate comprises a photoelectric detection laver and a driving electrode layer, the photoelectric detection layer comprises a plurality of photoelectric detection structures, the photoelectric detection structure comprises a third electrode, a fourth electrode, and a photoelectric conversion module arranged between the third electrode and the fourth electrode, and the photoelectric detection structure generates an electrical signal according to an incident light signal in a case where the photoelectric detection structure is turned on; and the driving electrode layer comprises a plurality of driving electrodes and a plurality of driving circuits and the driving circuit is configured to apply a voltage to the driving electrode such that a droplet moves in a microfluidic channel of the microfluidic channel layer; and wherein a plurality of the light source structures are disposed corresponding to one of the photoelectric detection structures; and in a direction perpendicular to the second substrate, an orthographic projection of one photoelectric conversion module covers orthographic projections of a plurality of the electroluminescence modules.

13. The microfluidic device of claim 12, wherein the driving electrode layer is arranged between the photoelectric detection layer and the microfluidic channel layer, wherein one of the driving electrodes is disposed corresponding to one of the light source structures; and in the direction perpendicular to the second substrate, an orthographic projection of the driving electrode overlaps with the electroluminescence module;

or, wherein one of the driving electrodes is disposed corresponding to k light source structures, wherein k is a positive integer greater than 1; and in the direction perpendicular to the second substrate, an orthographic projection of the driving electrode overlaps with k electroluminescence modules.

14. The microfluidic device of claim 11, wherein the driving electrode layer comprises a plurality of driving electrode units, and the driving electrode unit comprises y driving electrodes, wherein y is a positive integer greater than 1; and the driving circuit is configured to control a same voltage to be applied to each the driving electrode in the driving electrode unit, and the driving circuit is further configured to control a voltage difference between voltages to be applied to two adjacent driving electrode units, the voltage difference is greater than or equal to a droplet movement threshold voltage, such that the droplet moves in the microfluidic channel.

15. The microfluidic device of claim 12, wherein the third electrode is arranged between the fourth electrode and the microfluidic channel layer, and the third electrode is multiplexed as the driving electrode.

16. The microfluidic device of claim 12, wherein the light source layer comprises a light source control circuit, and the light source control circuit is configured to control the plurality of light source structures corresponding to one of the photoelectric detection structures to be turned on at different times; and the photoelectric detection structures are configured to be turned on at different times and output a plurality of electrical signals for droplet positioning;

wherein the light source control circuit is configured to control the light source structures in an area where the droplet is located, wherein light source structures that emit lights in a same wavelength band are turned on at a same time and light source structures that emit lights in different wavelength bands are turned on at different times; and photoelectric detection structures in the area where the droplet is located are configured to be turned on at different times and output the electrical signals for spectral detection.

17. The microfluidic device of claim 12, wherein the first electrode and the second electrode are arranged in a same layer and insulated, the electroluminescence module is arranged between the first electrode and the microfluidic channel layer, and the electroluminescence module comprises a micro light-emitting diode.

18. The microfluidic device of claim 12, wherein the first electrode and the second electrode are arranged in a same layer and insulated, the electroluminescence module is arranged between the first electrode and the second electrode, and the electroluminescence module comprises an organic luminescent material.

19. The microfluidic device of claim 12, wherein in a case where the light source structure is turned on, the light source structure of the light source layer is configured to emit light in a first wavelength band; or the light source layer comprises at least a first light source structure and a second light source structure, and the first light source structure is configured to emit light in a first wavelength band and the second light source structure is configured to emit light in a second wavelength band.

20. The microfluidic device of claim 12, wherein the photoelectric detection structure further comprises a first switch device;

the second substrate further comprises a plurality of first source lines and a plurality of first gate lines that are insulated from each other; and a control end of the first switch device is electrically connected to the first gate line, a first end of the first switch device is electrically connected to the first source line, and a second end of the first switch device is electrically connected to the third electrode.

\* \* \* \* \*